United States Patent
Chua et al.

(10) Patent No.: US 7,310,358 B2
(45) Date of Patent: Dec. 18, 2007

(54) SEMICONDUCTOR LASERS

(75) Inventors: Christopher L. Chua, San Jose, CA (US); Michael A. Kneissl, Mountain View, CA (US); Patrick Y. Maeda, Mountain View, CA (US); Noble M. Johnson, Menlo Park, CA (US); Ross D. Bringans, Cupertino, CA (US); John E. Northrup, Palo Alto, CA (US); David K. Biegelsen, Portola Valley, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 255 days.

(21) Appl. No.: 11/015,990

(22) Filed: Dec. 17, 2004

(65) Prior Publication Data

US 2006/0133443 A1 Jun. 22, 2006

(51) Int. Cl.
- H01S 3/10 (2006.01)
- H01S 5/00 (2006.01)
- H01S 3/14 (2006.01)

(52) U.S. Cl. ............... 372/23; 372/45.01; 372/50.124; 372/50.1; 372/68

(58) Field of Classification Search ........... 372/23, 372/50.1–50.124, 68
See application file for complete search history.

(56) References Cited

U.S. PATENT DOCUMENTS

| | | | | |
|---|---|---|---|---|
| 4,476,563 A | * | 10/1984 | Van Ruyven | 372/50.1 |
| 4,831,629 A | * | 5/1989 | Paoli et al. | 372/50.123 |
| 4,870,652 A | | 9/1989 | Thornton | |
| 4,980,893 A | * | 12/1990 | Thornton et al. | 372/50.122 |
| 5,386,428 A | * | 1/1995 | Thornton et al. | 372/50.12 |
| 5,436,193 A | * | 7/1995 | Beernink et al. | 438/34 |
| 5,513,200 A | * | 4/1996 | Paoli | 372/50.122 |
| 5,764,676 A | * | 6/1998 | Paoli et al. | 372/50.122 |
| 5,812,576 A | * | 9/1998 | Bour | 372/45.01 |
| 5,982,799 A | * | 11/1999 | Bour et al. | 372/50.121 |
| 6,052,399 A | | 4/2000 | Sun | |

(Continued)

OTHER PUBLICATIONS

Sony Corporation, SLD265RP, data sheet acquired from Sony Japanese Web site as of Dec. 16, 2004, four pages.

(Continued)

*Primary Examiner*—Phillip Nguyen
(74) *Attorney, Agent, or Firm*—Leading-Edge Law Group, PLC; James T. Beran

(57) ABSTRACT

Lasers, such as in laser structures, can include two or more semiconductor structures that are substantially identical or that include the same semiconductor material and have substantially the same geometry, such as in closely spaced dual-spot two-beam or quad-spot four-beam lasers. The lasers can also include differently structured current flow or contact structures or different wavelength control structures. For example, current flow or contact structures can be differently structured to prevent or otherwise affect phase locking, such as by causing different threshold currents and different operating temperatures. Exemplary differences include that one laser's semiconductor structure can have an isolated area that does not receive electrical current from a covering conductive layer; conductive layers of two layers can have different thicknesses or lengths; one laser can have a patterned layer with high electrical resistance between its semiconductor structure and a conductive layer; or one laser's semiconductor structure can include regions of high electrical resistance adjacent its contact structure.

34 Claims, 13 Drawing Sheets

U.S. PATENT DOCUMENTS

| | | | |
|---|---|---|---|
| 6,058,124 A * | 5/2000 | Sun et al. | 372/50.122 |
| 6,136,623 A | 10/2000 | Hofstetter et al. | |
| 6,744,800 B1 | 6/2004 | Kneissl et al. | |
| 6,778,578 B2 * | 8/2004 | Lee et al. | 372/68 |
| 6,795,457 B2 * | 9/2004 | Song et al. | 372/23 |
| 2005/0105577 A1 * | 5/2005 | Fukuhisa et al. | 372/50 |

OTHER PUBLICATIONS

Coldren, L.A., and Corzine, S.W., "Diode Lasers and Photonic Integrated Circuits," New York, John Wiley & Sons, 1995, pp. 95-96, and 102-103.

Sony Corporation, "Industry's First High-Density Integrated Four-Beam Laser Diode for High-Speed LBP and DPPC—SLD262EP", undated, two pages.

* cited by examiner

FIG. 9
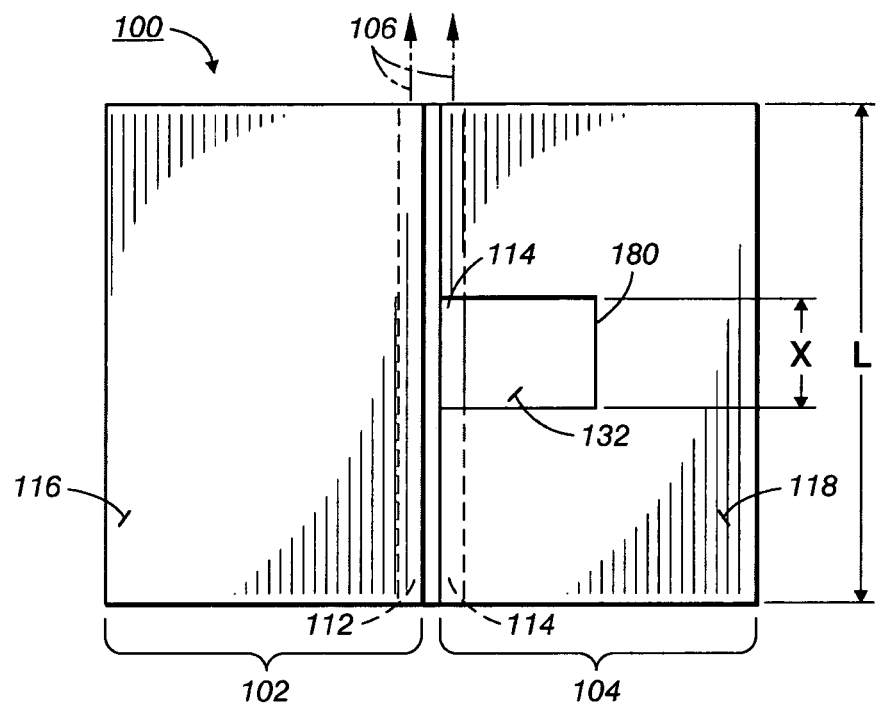
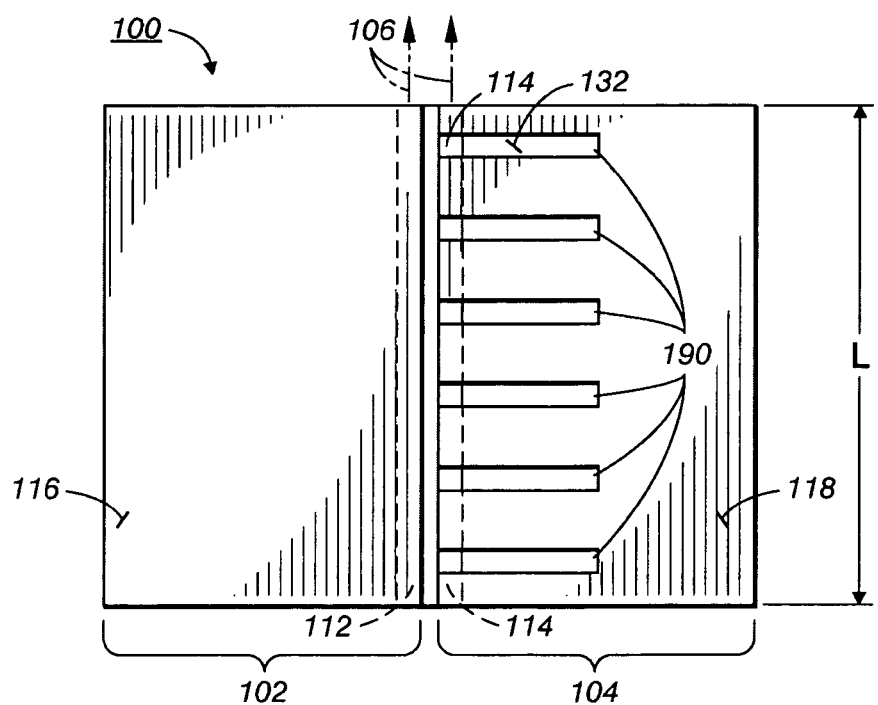
FIG. 10

FIG. 13
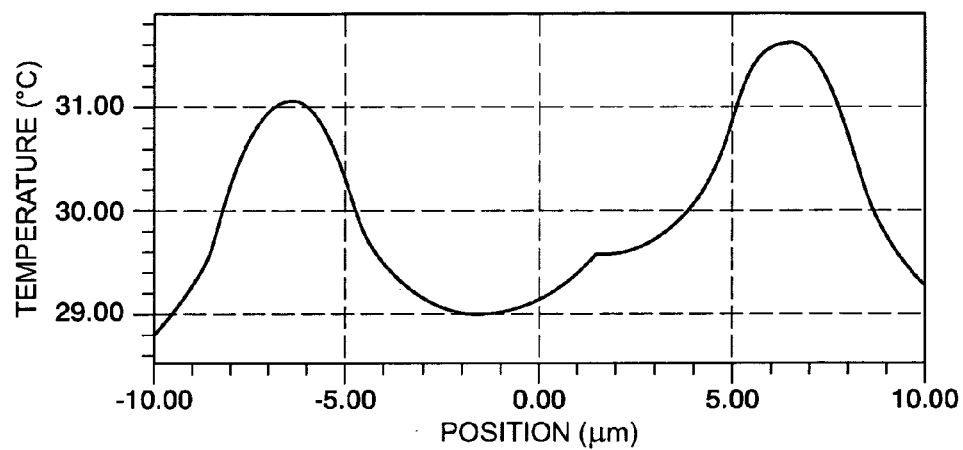
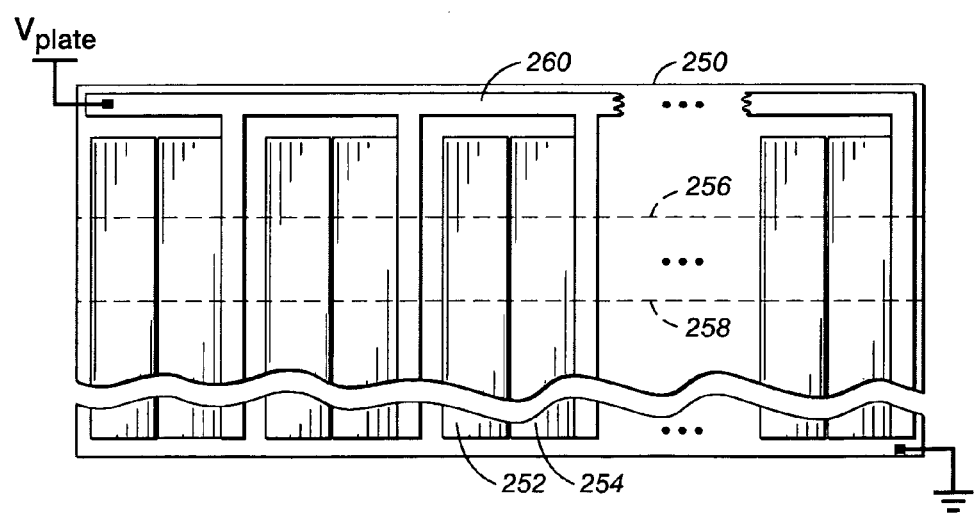
FIG. 14

SEMICONDUCTOR LASERS

BACKGROUND OF THE INVENTION

The present invention relates generally to techniques for semiconductor lasers. For example, the invention relates to techniques in which two or more beams of coherent light are emitted, such as from different active regions of a laser structure.

Various techniques have been proposed for multiple lasers or multi-beam lasers, and many such techniques are concerned with optical, electrical, and thermal interactions. U.S. Pat. No. 6,052,399, for example, describes an independently addressable laser array in which a high density, edge emitting laser array structure has native oxide layers formed in adjacent grooves in a p-cladding layer; the native oxide layers provide optical confinement and electrical isolation. U.S. Pat. No. 5,513,200 similarly describes a monolithic array of independently addressable diode lasers that are closely spaced but have low thermal, electrical, and optical crosstalk; an isolation groove is formed between adjacent laser elements, which are defined by rib loaded waveguides created by etching mesas above a planar active multilayer waveguide. U.S. Pat. No. 6,744,800 describes nitride based laser diode arrays on an insulating substrate, with contact layouts that reduce electrical and thermal crosstalk between laser diodes; buried layers are used to provide compact and low crosstalk contact structures. U.S. Pat. Nos. 4,870,652 and 4,980,893 both describe monolithic high density arrays of independently addressable semiconductor laser sources in which laser emitters or elements can be in close center-to-center proximity, e.g. on 3-10 μm centers, without undesirable phase locking and with minimal electrical and thermal interaction or crosstalk between independently addressed lasing elements.

Previous techniques, however, are limited in the ways they deal with optical interactions. It would be advantageous to have additional techniques for semiconductor laser structures, and, more specifically, it would be advantageous to have additional techniques that can be applied to alleviate optical interaction problems.

SUMMARY OF THE INVENTION

The invention provides various exemplary embodiments of devices, apparatus, and methods. In general, each embodiment involves a laser or laser structure in which at least two semiconductor structures emit light. The semiconductor structures may be substantially identical or may include the same semiconductor material and have substantially the same geometry.

These and other features and advantages of exemplary embodiments of the invention are described below with reference to the accompanying drawings, in which like reference numerals refer to components that are alike or similar in structure or function.

BRIEF DESCRIPTION OF THE DRAWINGS

FIGS. 9 and 10 are top plan views of other alternative implementations of a dual beam laser in which contact structures are structured differently to affect phase locking.

FIG. 13 is a graph showing temperature as a function of position in a simulation of the dual beam laser structure of FIGS. 11 and 12.

FIG. 14 is a top plan view of a stage in producing dual beam laser structures as in FIGS. 11 and 12.

DETAILED DESCRIPTION

Figure 1:
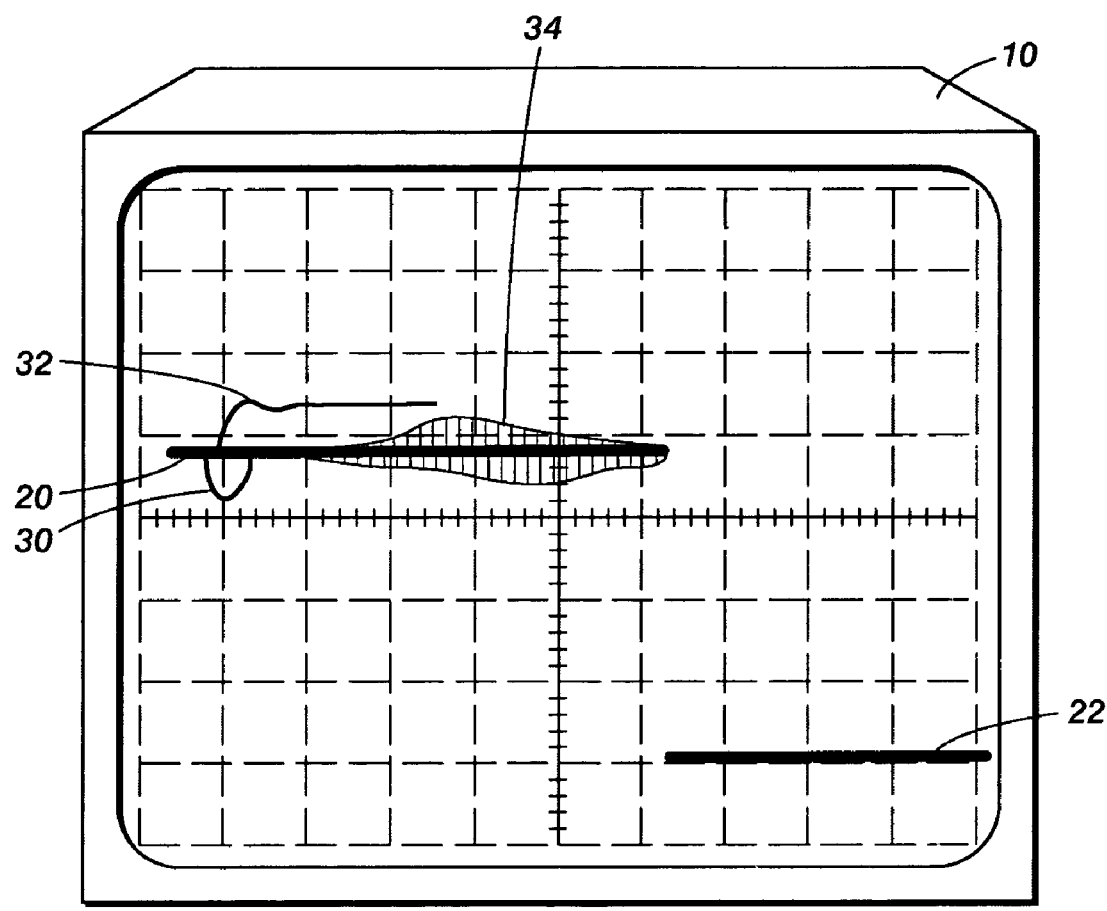
FIG. 1 is a schematic drawing of oscilloscope traces showing light power fluctuation caused by optical interference in a dual beam laser structure.

In the following detailed description, numeric ranges are provided for various aspects of the implementations described. These recited ranges are to be treated as examples only, and are not intended to limit the scope of the claims. In addition, a number of materials are identified as suitable for various facets of the implementations. These recited materials are to be treated as exemplary, and are not intended to limit the scope of the claims.

"Light" refers herein to electromagnetic radiation of any wavelength.

The term "laser" is used herein to mean any region, element, component, or device in which transitions of atoms or molecules between energy levels can be stimulated to cause emission of coherent light, such as in the ultraviolet, visible, or infrared regions of the spectrum. A "laser structure" is any structure that includes one or more lasers.

A "semiconductor structure" is any structure that includes sufficient semiconductor material to behave as a semiconductor, i.e. having electrical conductivity that can change between that of a conductor and that of an insulator depending on conditions such as temperature, presence of impurities, crystal defects, and so forth. A "semiconductor laser" is a laser in which a semiconductor structure emits light in response to stimulation.

Various techniques have been developed for producing structures with one or more dimensions smaller than 1 mm. In particular, some techniques for producing such structures are referred to as "microfabrication." Examples of microfabrication include various techniques for depositing materials such as growth of epitaxial material, sputter deposition, evaporation techniques, plating techniques, spin coating, and other such techniques; techniques for patterning materials, such as photolithography; techniques for polishing, planarizing, or otherwise modifying exposed surfaces of materials; and so forth.

In general, structures, elements, and components described herein are supported on a "support structure" or "support surface", which terms are used herein to mean a structure or a structure's surface that can support other structures; more specifically, a support structure could be a "substrate", used herein to mean a support structure on a surface of which other structures can be formed or attached by microfabrication or similar processes.

The surface of a substrate or other support structure is treated herein as providing a directional orientation as follows: A direction away from the surface is "up" or "over", while a direction toward the surface is "down" or "under". The terms "upper" and "top" are typically applied to structures, components, or surfaces disposed away from the surface, while "lower" or "underlying" are applied to structures, components, or surfaces disposed toward the surface. In general, it should be understood that the above directional orientation is arbitrary and only for ease of description, and that a support structure or substrate may have any appropriate orientation.

An "edge emitting laser" is a semiconductor laser on a support surface in which coherent light is emitted in a direction that is not perpendicular to the support surface, typically from an edge of a semiconductor structure. Within an edge emitting laser, the direction of light emission is referred to as the laser's "longitudinal direction".

FIG. 1 is a schematic drawing showing oscilloscope 10, the screen of which shows a trace of power output from a test apparatus as a function of time. In the test apparatus, dual beam infrared lasers were aimed at an aperture, producing an interference pattern on a photodetector behind the aperture. The lasers were activated with a periodic pulse signal provided concurrently to both lasers, and the output from the photodector was provided to oscilloscope 10.

The resulting trace shown in FIG. 1 includes two main parts, ON trace 20 and OFF trace 22, corresponding respectively to the time during which the pulsed signal is high and the time during which it is low in each period. The trace in FIG. 1, however, shows additional lines and areas that indicate power fluctuations due to interference between the two lasers. For example, lines 30 and 32 illustrate that, during a few pulses, the output power experienced a transient shortly after the pulse went on, and, for line 32, the output power stabilized at a value higher than ON trace 20. Area 34, on the other hand, illustrates variations in output power that began to occur after the lasers had been emitting for approximately half of the pulse width, at which time output power wandered away from ON trace 20 during many of the pulses. Lines 30 and 32 and area 34 are typical of trace features due to laser interference. But the underlying interference process is random and uncontrolled, so that many other types of features would indicate interference. If the lasers were emitting independently, without interference, oscilloscope 10 would show only ON trace 20 and OFF trace 22.

Experimentation shows that power fluctuations as illustrated by lines 30 and 32 and by area 34 are likely due to coherent optical interference between two light beams from a dual beam laser device, such as when both laser emitters are turned on to obtain about the same output power. This type of power fluctuation can occur if the two lasers are emitting at the same wavelength and are phase-locked for sufficient periods of time during operation.

As used herein, the term "phase locking" refers to an interference phenomenon in which two or more sources of coherent light at the same wavelength interact so that their emitted light is in phase. Since there is no known mechanism by which unreflected emitted beams alone could cause phase locking, it is generally believed that phase locking depends on some sort of "cross talk," meaning a transfer of information between laser elements. Optical cross talk, for example, could transfer phase information from one laser element to another. Optical cross talk can be internal, such as by scattering within a device, or external, such as by reflection of an emitted beam of one laser to another.

Phase locking is easily induced between closely spaced lasers that share identical active layers and have the same device structure. For such lasers, even a small amount of optical cross talk can produce phase locking if the two lasers are emitting at the same wavelength.

In another typical case, lasers may emit at slightly different wavelengths, but their spectra of emission may overlap sufficiently under certain operating conditions to cause phase locking. As used herein, the term "operating conditions" refers to a combination of conditions under which the laser is operated, such as current, voltage, output power, temperature, and so forth. In an apparatus, such as a printer, a laser may operate within a "range of operating conditions", meaning all the combinations of operating conditions encountered in normal operation of the apparatus. Overlap between wavelength spectra under certain operating conditions allows phase locking in the presence of optical cross talk.

Since the wavelength spectrum of an edge-emitting laser shifts with operating current due to thermally-induced bandgap shrinkage, changes in operating current can cause spectra of lasers to overlap. More specifically, higher operating currents produce more heating, causing material gain profile to shift to longer wavelengths. The lasing spectrum shifts correspondingly with the gain peak. For example, for most gallium arsenide (GaAs) lasers, the spectrum is red shifted by about 0.3 nm/degree Centigrade. As operating current of one laser element of a dual beam device changes, its spectrum may sweep across the spectrum of the other laser element, resulting in overlap. Similarly, two closely-spaced thermally-coupled lasers using the same active material and having identical device structures would have overlapping wavelength spectra under operating conditions in which their operating currents and output powers are approximately the same.

Although phase locking might be desirable or useful in some contexts, it causes problems in others. For example, if a dual beam laser device susceptible to phase locking is used in a laser printer, some areas of an image will be incompletely printed due to incomplete toner transfer. This phenomenon, referred to as "hatching," typically occurs when dual beam lasers are used in interlace 1 scan mode. In this case, phase locking and the resulting power fluctuations are detrimental to printer operation.

Because hatching is a serious problem in printers, dual beam lasers cannot be used in a given printer if they are susceptible to phase locking when operated in the printer's range of operating conditions. One approach is to simply test each laser device, in the manner described above in relation to FIG. 1 or in a similar manner, to determine whether hatching will occur. If a laser device would produce hatching, it must then be thrown away, resulting in a severe yield penalty and narrowly constraining how and in which printer platform each laser device can be used.

One solution to phase locking and the resulting power fluctuations would be to eliminate optical cross talk, including scattering within the device structure itself, back reflection off of the cover glass of a package containing the device, and so forth. In a dual beam laser device, a quad beam laser device, or another multi-beam laser device, the laser elements are positioned in close proximity, making it difficult to block out all sources of optical cross talk. Furthermore, a minute internal or external perturbation could negate a reduction in internal cross talk.

Figure 2:
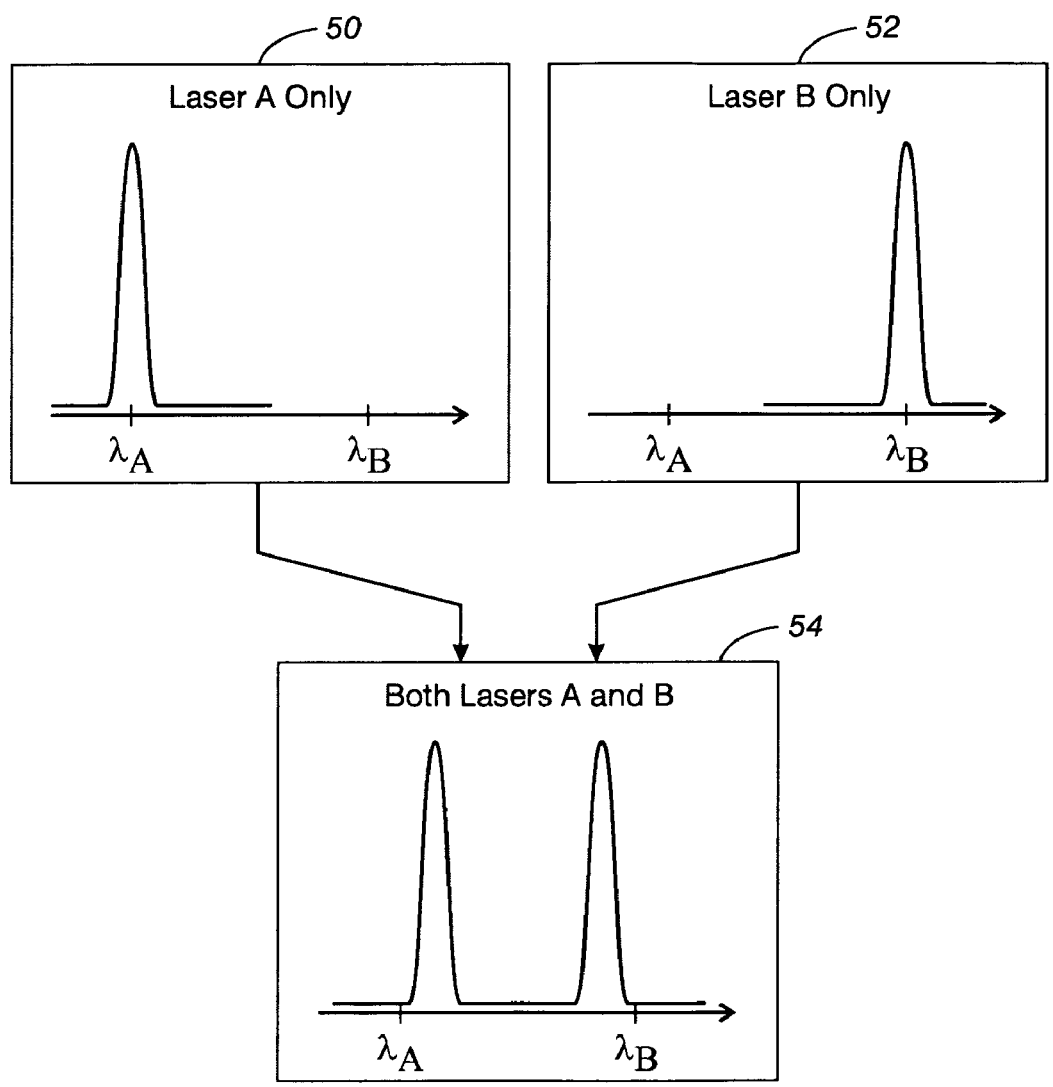
FIG. 2 shows graphs illustrating a typical relationship between simplified spectra of non-phase locking dual beam lasers when operated one at a time and concurrently.

FIG. 2 illustrates another solution to the problem of phase locking due to optical cross talk. As illustrated in boxes 50 and 52, the two independently addressable lasers in a dual beam device, referred to as laser A and laser B, have spectra with different central wavelengths. As shown in box 50, the central wavelength for laser A is $\lambda_A$; similarly the central wavelength for the spectrum of laser B is $\lambda_B$. The difference $\Delta\lambda_{AB}(=\lambda_B-\lambda_A)$ is sufficiently great that when both lasers A and B are turned on, their combined spectrum, shown in box 54, includes two distinct peaks without overlap. This is true even though the peak attributable to each laser has illustratively shifted somewhat toward the other laser's wavelength. Since the two peaks do not overlap, phase locking is prevented even with small amounts of internal or external optical cross talk. As a result, power fluctuations of the type illustrated in FIG. 1 do not occur under operating conditions of interest, and hatching is also prevented if the dual beam device is used in a printer.

The general solution illustrated in FIG. 2 is inherently present where lasers A and B have different semiconductor structures and, therefore, different central wavelengths. See, for example, U.S. Pat. No. 6,136,623, describing multiple wavelength laser arrays fabricated by flip-chip bonding from laser structures on different substrates.

The general solution illustrated in FIG. 2 is also applicable in other contexts, even under a constraint such as that lasers A and B must have substantially identical semiconductor structures or that their semiconductor structures must include the same semiconductor material and have substantially the same geometry. This type of constraint, referred to herein as a "semiconductor symmetry constraint," often applies to commercially available laser products. For example, Sony Corporation has a dual spot two-beam laser product designated SLD263KP in which two adjacent edge-emitting lasers are substantially identical, separated by a groove or trench within which sidewalls are passivated for greater isolation. It would be advantageous to implement the general solution of FIG. 2 for such a product without modifying the semiconductor structures of the lasers, especially if this could be done without modifying the fabrication process, the device architecture, or the epitaxial design.

Even where two or more lasers satisfy a semiconductor symmetry constraint, other parts of the lasers can be differently structured, and some of these differences can result in different wavelength spectra. In a given application, the laser elements will be operated within a range of operating conditions, so that the difference in wavelength will be sufficient if it prevents phase locking within the relevant range of operating conditions. In other words, it is not necessary to prevent phase locking under all possible operating conditions, but only under those that will be encountered in actual operation. As used herein, the term "required difference in wavelength" refers to a difference between wavelengths emitted by two lasers that is sufficient to prevent interference between the lasers within the range of operating conditions of the application for which they are used.

Figure 3:
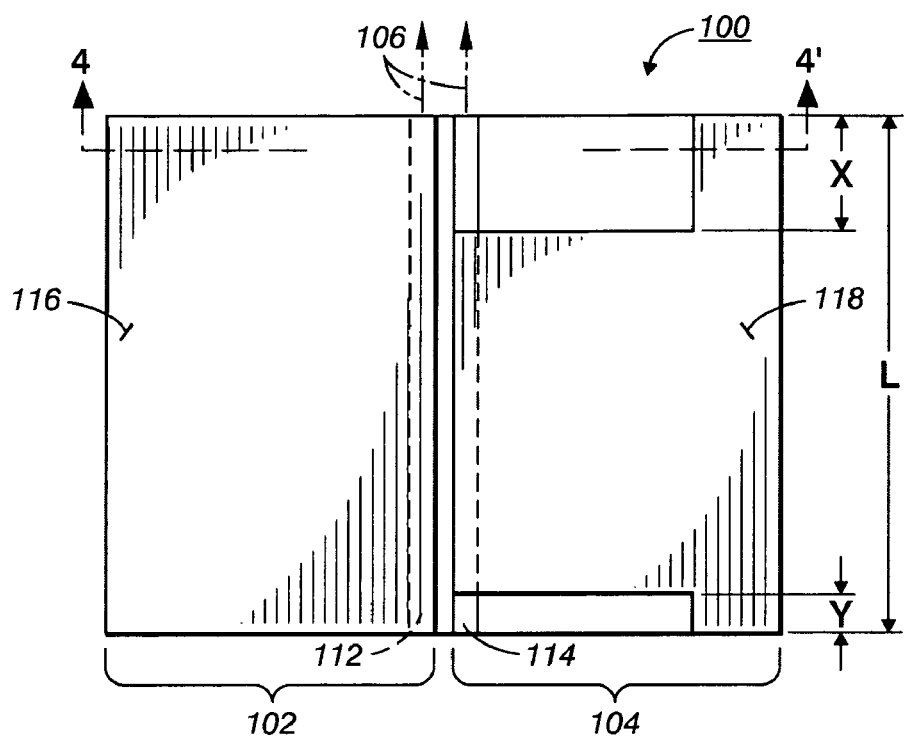
FIG. 3 is a top plan view of a dual beam laser structure in which contact structures are structured differently to affect phase locking.

FIG. 3 shows dual beam laser device 100, with independently addressable laser elements 102 and 104. Arrows 106 show where laser elements 102 and 104 emit light from two closely spaced regions. Arrows 106 are at the end of respective laser stripes 112 and 114, with laser stripe 112 in turn being completely covered by contact metal 116 and laser stripe 114 being partially covered by contact metal 118.

FIG. 3 also shows a difference in structure between contact metal 116 and contact metal 118. While metal pad 116 completely covers laser stripe 112 along its entire length L, contact metal 118 does not cover a length of X at the emitting end of laser stripe 114 and similarly does not cover laser stripe 114 for a length of Y at the opposite end of laser stripe 114. Therefore, device 100 illustrates differently structured current flow structures for lasers 102 and 104, where the term "current flow structure" is used herein to mean a structure through which electrical or thermal current flows to or from a laser's semiconductor structure that emits light.

Unless specified as electrical or thermal, the terms "current" and "current flow" are used herein to include electrical current or thermal current or other conductive transfer of electrical or thermal energy between positions or regions; in general, these terms include not only total current but also distribution of current in varying current densities. Accordingly, the term "conductive path" means any path along which one or both of electrical or thermal current can flow through a structure. Although most semiconductor lasers have a single structure that provides conductive paths for both electrical and thermal current to or from a semiconductor structure, a laser's current flow structure could include more than one such structure or even separate substructures for electrical and thermal currents.

Figure 4:
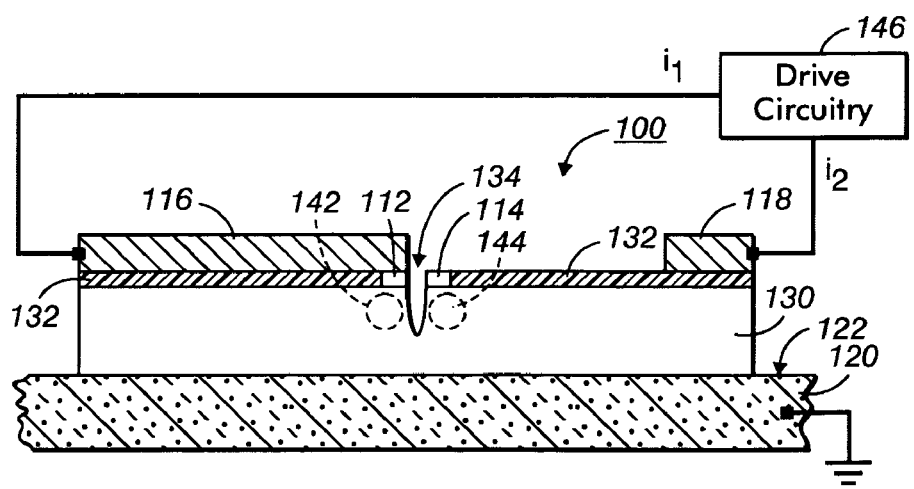
FIG. 4 is a cross-sectional view taken along the line 4-4' in FIG. 3, with related circuitry shown schematically.

FIG. 4 is a cross-sectional view of FIG. 3 along the line 4-4'. The same cross-section would be seen through the region at the opposite end of laser stripe 114, along a line parallel to line 4-4'.

Substrate 120 has surface 122 at which device 100 has been fabricated. Substrate 120 can, for example, be an n-type GaAs substrate, in which case it is conductive and would be connected to a common ground as shown in FIG. 4.

Epitaxial structure 130 for both lasers 102 and 104 is produced at surface 122 by epitaxial deposition, such as by conventional techniques described, for example, in U.S. Pat. No. 6,052,399, incorporated herein by reference. Epitaxial structure 130 can include an n-type lower cladding layer, an undoped lower confinement layer, an active layer, an undoped upper confinement layer, and a p-type upper cladding layer. Laser stripes 112 and 114 are also epitaxial materials. The stripes for both lasers 102 and 104 can also be concurrently formed, by concurrent epitaxial deposition and then by concurrently photolithographically patterning and etching the upper cladding layer and additional doped semiconductor layers that provide ohmic contacts. FIG. 4 thus illustrates an implementation in which the semiconductor structures of lasers 102 and 104 are concurrently formed and can be substantially identical.

In areas other than laser stripes 112 and 114, insulating layer 132 is present, and can be, for example, an oxide or nitride produced by a plasma-enhanced chemical vapor deposition (PECVD) process. Insulating layer 132 therefore prevents current flow from metal contacts 116 and 118 to epitaxial structure 130 except through laser stripes 112 and 114.

For further isolation between laser elements 102 and 104, trench 134 is etched between laser stripes 112 and 114, extending to a sufficient depth to separate the light emitting active regions within epitaxial structure 130. In a typical implementation, trench 134 may have a depth of 6 µm or more. Trench 134 could, for example, have a width of 3 µm or more, and each of laser stripes 112 and 114 could have a height of 2 µm and a width of 4 µm. These dimensions are merely illustrative, however, and the depth of trench 134 depends on the design of epitaxial structure 130, while the dimensions of laser stripes 112 and 114 depend on the emission characteristics desired.

FIG. 4 also illustrates how the two laser emitting active regions 142 and 144 are positioned below laser stripes 112 and 114, respectively. Drive circuitry 146 provides appropriate drive signals to device 100, including current signal $i_1$ to metal contact 116 and current signal $i_2$ to metal contact 118, with the current signals $i_1$ and $i_2$ in general being different because lasers 102 and 104 are independently addressable; drive circuitry 146 could be any suitable circuitry, including conventional circuitry or foreseeable modifications. Region 142 receives injected current in response to signal $i_1$ provided to metal contact 116, while region 144 receives injected current in response to signal $i_2$ provided to metal contact 118. Since, however, metal contact 118 does not extend over laser stripe 114 for part of the length L of laser stripe 114, the current flow through epitaxial structure 130 is affected, as discussed in greater detail below, and this in turn affects the threshold current, which affects the operating temperature, which in turn affects the lasing wavelength, and hence affects phase locking between regions 142 and 144.

Device 100 thus includes a support structure, implemented by substrate 120, and at least two lasers on the support structure. Each of a subset of the lasers, in this case both of them, includes a semiconductor structure that emits light in response to stimulation, implemented as the parts of epitaxial structure 130 that include regions 142 and 144, respectively. The semiconductor structures meet a semiconductor symmetry constraint, because they include the same semiconductor material and have substantially the same geometry; indeed, they are substantially identical. Each laser also includes a current flow structure, implemented for the first laser by metal contact 116 and ohmic contact layers within laser stripe 112 and for the second laser by metal contact 118 and ohmic contact layers within laser stripe 114. In both cases, the current flow structure affects current flow through the laser's semiconductor structure, but the difference in the current flow structures of the pair of lasers affects phase locking. More specifically, as shown below, phase locking can be prevented in a range of operating conditions if the differences are appropriately designed.

Device 100 also illustrates an example in which each of a subset of lasers with substantially identical semiconductor structures has a contact structure electrically or thermally connected to its semiconductor structure. The semiconductor structure has an emitting region, and the contact structure and semiconductor structure provide a conductive path between the emitting region and an external component such as drive circuitry or a heat sink. The conductive paths in a pair of the lasers have different characteristics that affect the wavelengths of light emitted by their emitting regions.

Device 100 also illustrates an example of a wavelength control structure that affects the wavelength at which each laser's semiconductor structure emits light. As explained in detail below, the wavelength control structures of regions 142 and 144 are different so that the wavelengths at which they emit differ by at least a required difference in wavelength, in this case a difference sufficient to prevent phase locking within a desired range of operating conditions.

Device 100 and other components in FIG. 4, such as drive circuitry 146, also illustrate features of apparatus with a laser device and drive circuitry that drives each laser within a respective range of operating conditions. If the apparatus is a laser printer, for example, the appropriate range of operating conditions is that for dual beam laser devices operating within the particular laser printer. The current flow structures can be sufficiently different to prevent phase locking between lasers when each is driven within its respective range of operating conditions, as explained below.

Theoretical considerations indicate that the wavelengths differ because the asymmetry between the current flow structures of the lasers in device 100 makes the effective cavity lengths of regions 142 and 144 different. While metal contact 116 extends over laser stripe 112 for its full length L, metal contact 118 extends over laser stripe 114 only for a length of (L−(X+Y)), where 0<X+Y<L, 0≦X<L, and 0≦Y<L, so that (L−(X+Y)) is somewhat less than the full available cavity length. As a result, the carrier density distribution for region 144 is non-uniform along laser stripe 114, changing the effective cavity length which, in turn, changes the threshold gain and the threshold current of region 144. As a result, the operating temperature of region 144 is different from region 142, and the wavelength at which region 144 emits is shifted relative to region 142 at a given level of current, with the lengths X and Y chosen so that the difference is sufficient to prevent phase locking despite the present of some optical cross talk.

Figure 5:
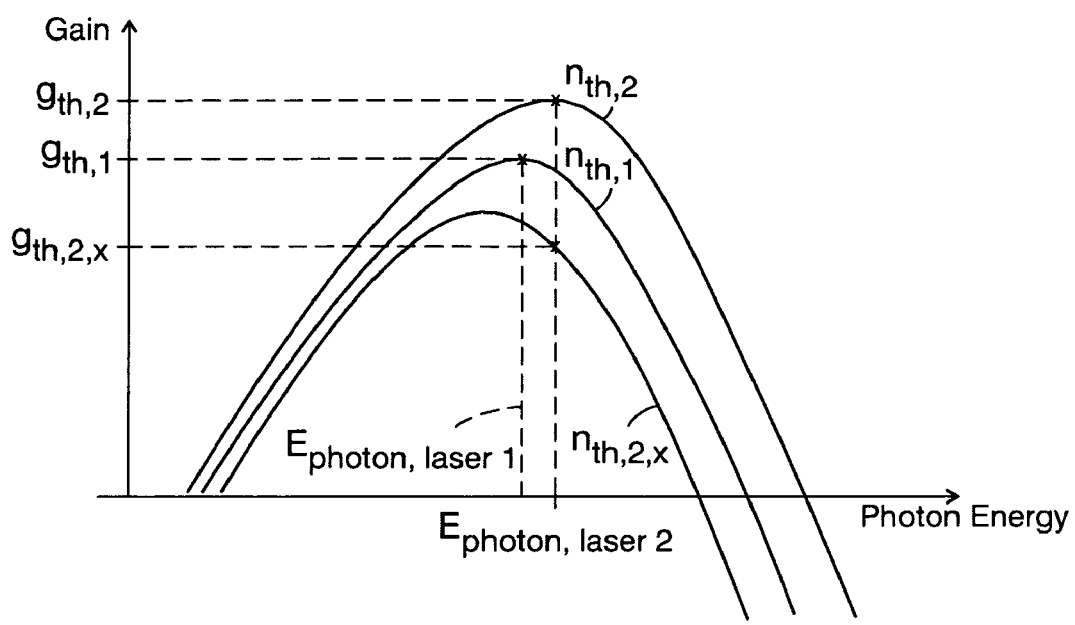
FIG. 5 is a graph showing gain as a function of photon energy for the dual beam laser structure in FIGS. 3 and 4.

FIG. 5 illustrates this theory in greater detail, showing gain versus photon energy for both regions 142 and 144 at different carrier densities. Treating laser element 102 as laser 1 and laser element 104 as laser 2, laser 1 has a carrier concentration $n_{th,1}$ along the entire length of laser stripe 112. The gain produced by this carrier density, shown by the middle curve in FIG. 5, has a peak value of $g_{th,1}$, and this peak value is the only gain value sufficient for laser action by laser 1. Since the peak gain is for photons with an energy of $E_{photon,laser1}$, the laser light emitted would have a wavelength corresponding to $E_{photon,laser1}$. Photons at other energy levels do not experience sufficient gain to reach lasing threshold.

Although there is no contact metal along the uppermost and lowermost unmetallized parts of laser stripe 114, as shown in FIG. 3, current from metal contact 118 will still spread there because the epitaxial layers of laser stripe 114 are highly conductive. But the carrier concentration in the unmetallized regions, $n_{th,2,x}$ will be less than the carrier concentration $n_{th,2}$ in areas where laser stripe 114 is under metal contact 118, due to differences in spreading resistance. Therefore, for any photon energy, the gain in the uppermost and lowermost regions of laser stripe 114, $g_{th,2,x}$ will be less than the gain $g_{th,2}$ of laser 2 in regions covered by metal contact 118, as shown by the upper and lower curves in FIG. 5. It can be shown that the non-uniform gain distribution in laser 2 makes the effective cavity length of laser 2 different from the length L of laser stripe 114.

The lasing threshold condition for laser 1 is:

$$g_{th,1} = \frac{1}{2L}\ln\frac{1}{R_1 R_2} + \alpha \quad \text{(eq. 1)}$$

where $g_{th,1}$ is the threshold gain of laser 1, $\alpha$ is the cavity optical loss and $R_1$ and $R_2$ are the front and back facet mirror reflectivities, respectively. This expression comes from the well-known self-consistency boundary condition of laser action. Similarly, the lasing threshold conditions for laser 2 can be expressed as $$g_{th,2} = \frac{1}{2L_{e\!f\!f}}\ln\frac{1}{R_1 R_2} + \alpha \quad \text{(eq. 2)}$$

$$g_{th,2,x} = \frac{1}{2L_{e\!f\!f,x}}\ln\frac{1}{R_1 R_2} + \alpha \quad \text{(eq. 3)}$$

where $g_{th,2}$ and $g_{th,2,x}$ are the threshold gains of laser 2 in the metallized and unmetallized sections of the laser, respectively, and $L_{e\!f\!f}$ and $L_{e\!f\!f,x}$ are effective lengths for the respective gain values.

By doing a self-consistency boundary condition analysis on laser 2, it can be shown that the effective lengths $L_{e\!f\!f}$ and $L_{e\!f\!f,x}$ are given by the following expressions:

$$\frac{L_{e\!f\!f}}{L} = 1 - \frac{X+Y}{L}\left(1 - \frac{g_{th,2,x} - \alpha}{g_{th,2} - \alpha}\right) \quad \text{(eq. 4)}$$

$$\frac{L_{e\!f\!f,x}}{L} = \left(\frac{g_{th,2} - \alpha}{g_{th,2,x} - \alpha}\right)\left(1 - \frac{X+Y}{L}\right) + \frac{X+Y}{L} \quad \text{(eq. 5)}$$

As explained above, $g_{th,2,x} < g_{th,2}$ because of higher spreading resistance and lower carrier density in the unmetallized region. It follows that $g_{th,2,x} - \alpha < g_{th,2} - \alpha$. Since the unmetallized region is shorter than the laser stripe length, i.e., $X+Y<L$, equations 4 and 5 imply that $L_{e\!f\!f}<L$ and $L_{e\!f\!f,x}>L$. From equations 1-3, it follows that $g_{th,2}>g_{th,1}$ and $g_{th,2,x}<g_{th,1}$, as shown graphically in FIG. 5, which shows the situation for lasers 1 and 2 in which the carrier densities have the relationship $n_{th,2}>n_{th,1}>n_{th,2,x}$.

The threshold gains of lasers 1 and 2 are indicated on the vertical axis in FIG. 5. FIG. 5 shows the threshold gain of laser 2, $g_{th,2}$ occurring at a higher photon energy $E_{photon, \, laser \, 2}$ than that of laser 1, $E_{photon, \, laser \, 1}$. As discussed below, however, the actual spectrum of laser 2 is red shifted relative to laser 1. Laser 2 has a higher threshold current than laser 1, and is consequently operated at higher currents. The resulting higher operating temperature shifts the gain curve to longer wavelengths due to bandgap shrinkage. This heating effect dominates and determines the spectral characteristics.

To analyze the relationship between laser 1's threshold current $i_{th,1}$ and laser 2's threshold current $i_{th,2}$, it is useful to note that laser 2 has higher average electrical resistance. Therefore, laser 2 has a lower quantum efficiency than laser 1. Also, laser 2 has a higher threshold current than laser 1, i.e. $I_{th,2}>I_{th,1}$.

$I_{th,2}$ is the sum of the current in the metallized region and the current in the unmetallized region at threshold:

$$I_{th,2} = J_{th,2} * (L-(X+Y)) * W + J_{th,2,x} * (X+Y) * W \quad \text{(eq. 6)}$$

where $J_{th,2}$ and $J_{th,2,x}$ are the current densities at threshold for the metallized and unmetallized regions of the laser, respectively. W is the stripe width, $L-(X+Y)$ is the length of the metallized region, and $X+Y$ is the length of the unmetallized region.

Similarly, $I_{th,1}$ is $$I_{th,1} = J_{th,1} * L * W \quad \text{(eq. 7)}$$

where $J_{th,1}$ is the threshold current density of laser 1 and L is the cavity length. Since laser stripes 112 and 114 are equal in width, the same value of W is used in equations 6 and 7.

From equations 1, 2, 4, and 5, it follows that:

$$\frac{g_{th,2}-\alpha}{g_{th,1}-\alpha} = \frac{L}{L_{e\!f\!f}} = \frac{1}{1-\frac{X+Y}{L}} - \left(\frac{g_{th,2,x}-\alpha}{g_{th,1}-\alpha}\right) * \left(\frac{X+Y}{L-(X+Y)}\right) \quad \text{(eq. 8)}$$

The next step in finding the relationship between threshold current and device geometry is to recognize that material gain, $g-\alpha$, is approximately proportional to the carrier density, n, and that injection current is approximately proportional to the square of the carrier density, $n^2$. The latter relation arises from the fact that injection current is dominated by contributions to electron-hole recombination. Therefore, $$\frac{J_{th,2,x}}{J_{th,1}} = \left(\frac{n_{th,2,x}}{n_{th,1}}\right)^2 = \left(\frac{g_{th,2,x}-\alpha}{g_{th,1}-\alpha}\right)^2 \quad \text{(eq. 9)}$$

and, using equation 8, $$\frac{J_{th,2}}{J_{th,1}} = \left(\frac{n_{th,2}}{n_{th,1}}\right)^2 = \quad \text{(eq. 10)}$$

$$\left(\frac{g_{th,2}-\alpha}{g_{th,1}-\alpha}\right)^2 = \left[\frac{1}{1-\frac{X+Y}{L}} - \left(\frac{g_{th,2,x}-\alpha}{g_{th,1}-\alpha}\right) * \left(\frac{X+Y}{L-(X+Y)}\right)\right]^2$$

It follows from equations 6, 7, 9, and 10 that $$\frac{I_{th,2}}{I_{th,1}} = \quad \text{(eq. 11)}$$

$$\frac{L}{L-(X+Y)} + \left(\frac{g_{th,2,x}-\alpha}{g_{th,1}-\alpha}\right) * \left(\frac{X+Y}{L-(X+Y)}\right) * \left(\frac{g_{th,2,x}-\alpha}{g_{th,1}-\alpha} - 2\right)$$

Equation 11 implies that $I_{th,2}>I_{th,1}$ as the situation should be. This relationship becomes apparent through the following consideration: Since any number squared is a positive number, we have $$((g_{th,1}-\alpha)-(g_{th,2,x}-\alpha))^2 > 0 \quad \text{(eq. 12)}$$

$$(g_{th,1}-\alpha)^2 > 2*(g_{th,1}-\alpha)*(g_{th,2,x}-\alpha) - (g_{th,2,x}-\alpha)^2 \quad \text{(eq. 13)}$$

Rearranging equation 13, $$\left(\frac{g_{th,2,x} - \alpha}{g_{th,1} - \alpha}\right)\left(\frac{g_{th,2,x} - \alpha}{g_{th,1} - \alpha} - 2\right) > -1 \quad \text{(eq. 14)}$$

or $$\left(\frac{g_{th,2,x} - \alpha}{g_{th,1} - \alpha}\right) * \left(\frac{g_{th,2,x} - \alpha}{g_{th,1} - \alpha} - 2\right) * (X + Y) > L - (X + Y) - L \quad \text{(eq. 15)}$$

Using the inequality of equation 15 in equation 11 produces $I_{th,2} > I_{th,1}$. In practice, $g_{th,2,x}$ is usually significantly smaller than $g_{th,1}$ because of the lower carrier concentration in the unmetallized region of the laser stripe. In these circumstances, equation 11 yields $$\frac{I_{th,2}}{I_{th,1}} \approx \frac{L}{L - (X + Y)} \quad \text{(eq. 16)}$$

Equation 16 can be used to estimate values of X and Y that provide a desired wavelength shift, given a value of L. The wavelength shift results from the higher operating temperature of laser 2 caused by higher threshold current of laser 2. As mentioned above, increased temperature causes bandgap shrinkage, leading to longer wavelength emission.

FIGS. 3-4 and other examples described below illustrate how to change the effective length of a semiconductor laser. A particular advantage of the technique in FIGS. 3-4 is that the only process change necessary is a change in the contact mask used in device fabrication—no additional masks are necessary and the same fabrication process can be used with the same device architecture and the same epitaxial structures having the same dimensions. As will be readily understood, the change in effective length may affect output power from the lasers, and drive circuitry 146 can provide an appropriate current signal to each laser so that both provide approximately the same output power. For example, a feedback system could be used within drive circuitry 146 to adjust level of current signals so that output power on both lasers is approximately the same. Other appropriate modifications could be made in drive circuitry 146 to adjust the drive current to accommodate various ranges of threshold current differences.

Figure 6:
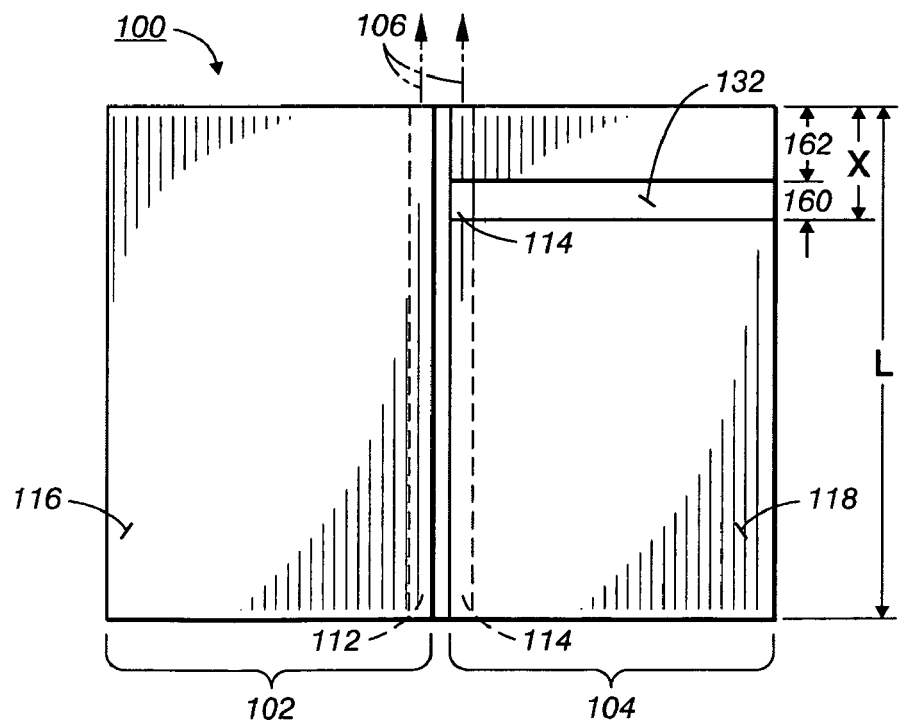
FIG. 6 is a top plan view of an alternative implementation of a dual beam laser in which contact structures are structured differently to affect phase locking.

FIG. 6 illustrates an alternative implementation that can be produced from an existing dual beam laser structure. The approach in FIG. 6 has been implemented using a Sony Corporation product, SLD263KP, for which L equals 500 μm and the width across lasers 102 and 104 together is 400 μm. The thickness of metal contacts 116 and 118 is approximately 1.35 μm, making it possible to selectively remove the metal by laser ablation. In the implementation in FIG. 6, cut 160 has been made through contact pad 118 by laser ablation, exposing laser stripe 114 as well as a portion of insulating layer 132; this provides one example of an "uncovered area", meaning an area along the longitudinal extent of a laser's semiconductor structure that is not covered by conductive material through which current flows to the semiconductor structure. In addition, cut 160 isolates fragment 162 of metal contact 118 so that fragment 162 does not receive any current from the drive circuitry through a wire bond connection to the remaining portion of metal contact 118; this provides one example of an "isolated area", meaning an uncovered area or another area along the longitudinal extent of a laser's semiconductor structure that does not receive current flow through covering conductive material.

The technique of FIG. 6 produces a non-uniform current distribution similar to that described in relation to FIG. 3-5, above. In the illustrated example, the isolated region has a length of X that is less than approximately 25% of length L of laser stripe 114. Various other ratios of X to L have been produced by laser ablation, as well as other cut patterns, and results have been similar to the above theory.

Figure 7:
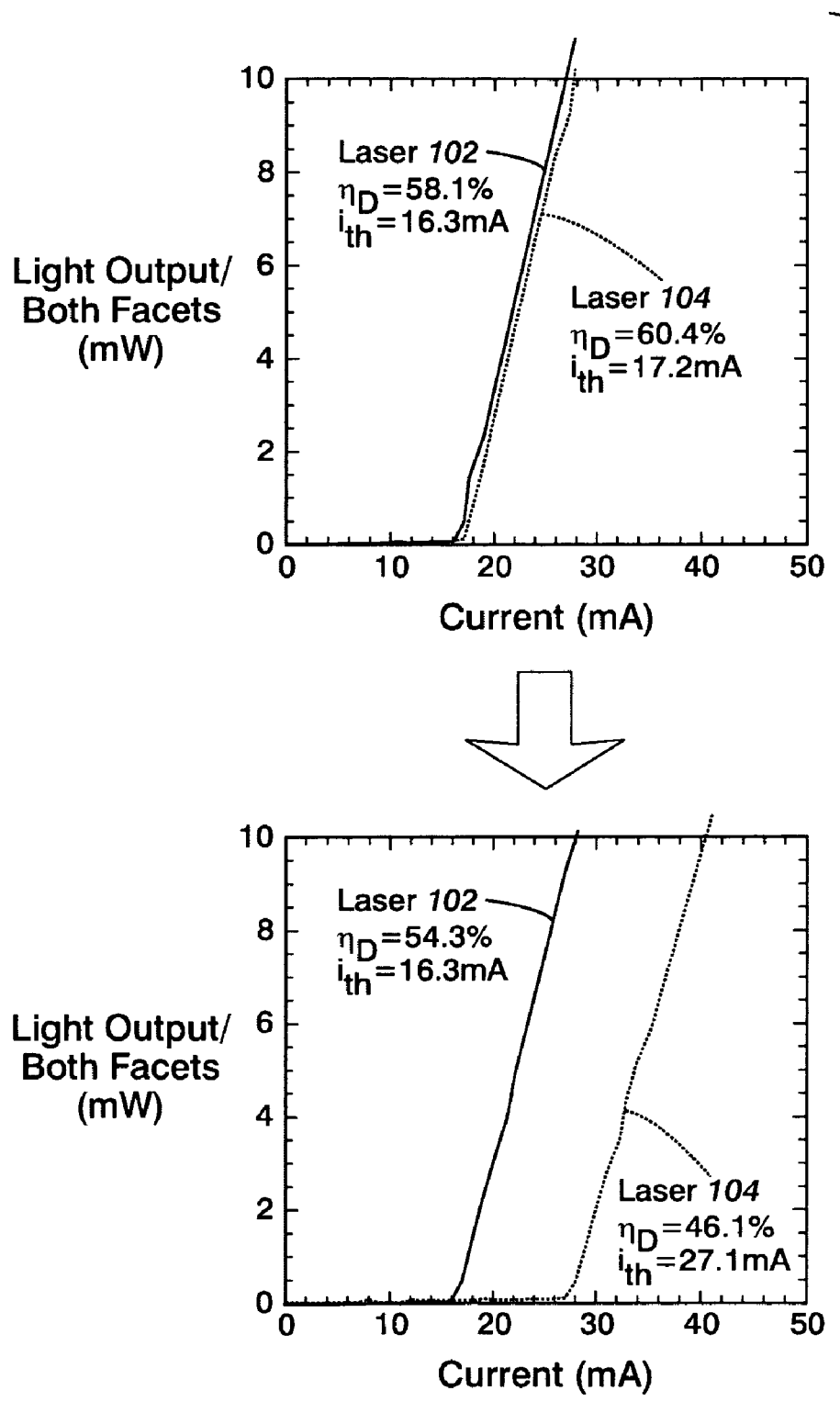
FIG. 7 shows graphs comparing light output as a function of current for a symmetric dual beam laser with that for the dual beam laser structure in FIG. 6.

FIG. 7 shows effects of cut 160 in FIG. 6. The upper graph in FIG. 7 shows operation of device 100 as in FIG. 6 but before cut 160 was made. The leftward curve indicates light output from laser 102, and the rightward curve indicates light output from laser 104, in both cases as a function of current. The lower graph in FIG. 7 shows operation of lasers 102 and 104 after cut 160 is made, with the leftward curve showing light output from laser 102 and the rightward curve from laser 104. As can be seen from the threshold currents shown in FIG. 7, the ratio is similar to that predicted by equation 16, above.

To achieve similar output powers from lasers 102 and 104 in FIG. 6, laser 104 requires a higher operating current than laser 102. This causes heating in laser 104, shifting its gain peak to longer wavelengths, and the Fabry-Perot modes that are excited will be red shifted relative to those of laser 102. In experimental trial, this wavelength shift prevented phase locking even in the presence of some optical feedback and despite changes in operating conditions within the range of interest. In the example of FIGS. 6 and 7, laser 102 requires an operating current of approximately 17.4 mA while laser 104 requires an operating current of 29.5 mA to obtain similar laser output power of approximately 2.5 mW.

Figure 8:
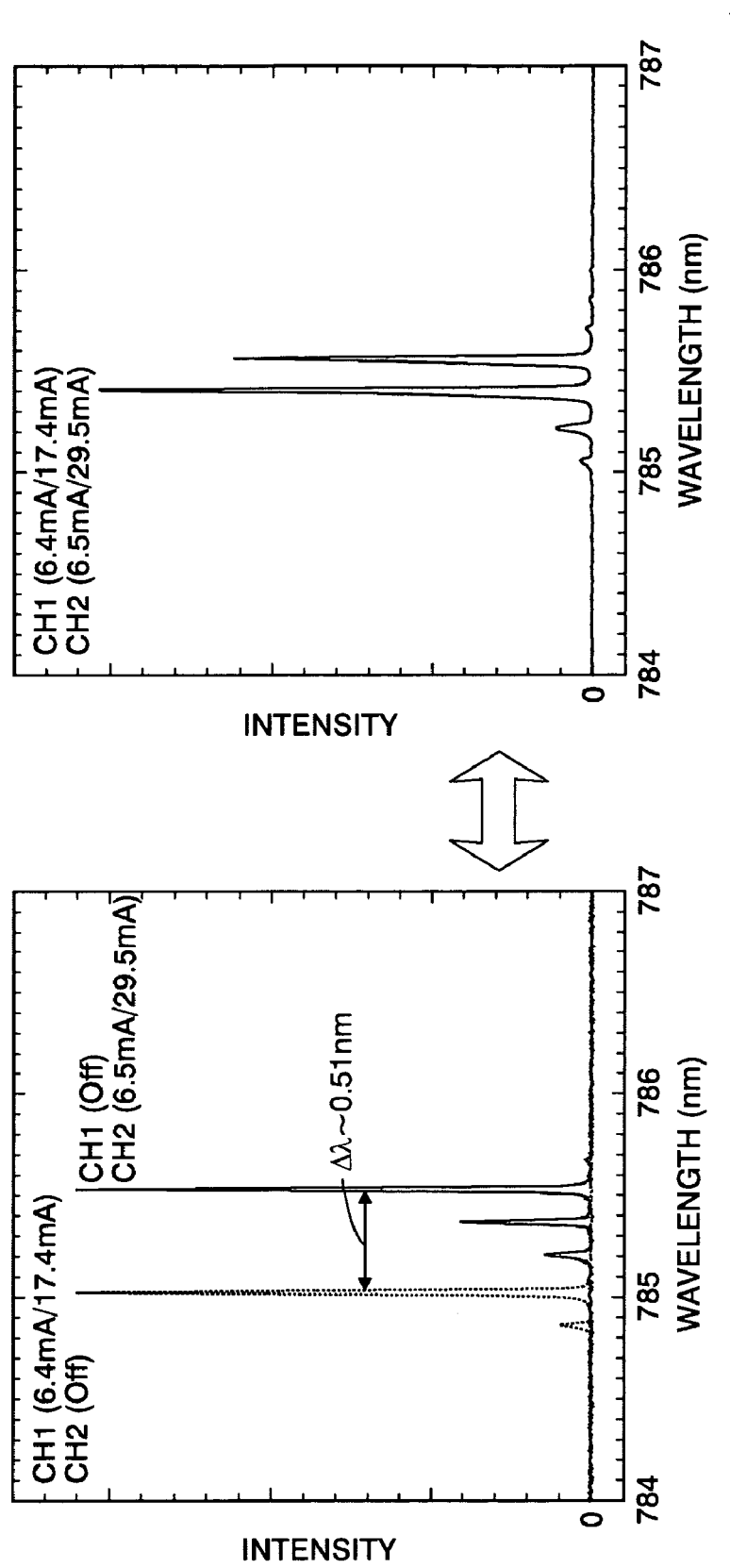
FIG. 8 shows graphs comparing intensity as a function of wavelength for the dual beam laser structure in FIG. 6, operated one at a time and concurrently.

FIG. 8 shows a comparison of wavelength spectra when lasers 102 and 104 in FIG. 6 are operated one at a time at the required operating currents, shown at left, and concurrently at the required operating currents, shown at right. Each graph shows intensity of emitted light as a function of wavelength, with the intensities not being to scale.

Prior to cut 160, lasers 102 and 104 would ordinarily emit at slightly different wavelengths, but, as shown in the leftward graph in FIG. 8, cut 160 causes a significant difference Δλ~0.51 nm between the two primary emission wavelengths resulting from the red shift of laser 104; the primary leftward wavelength peak is from laser 102, the primary rightward wavelength peak from laser 104. The graph also shows several smaller peaks representing secondary longitudinal modes, with the leftmost small peak being from laser 102 and the small peaks between the primary peaks being from laser 104.

The rightward graph in FIG. 8 shows that the difference between wavelengths is sufficient that phase locking does not occur within the operating range of interest. In other words, although the primary wavelengths of lasers 102 and 104, indicated by the two tallest peaks, are closer during concurrent operation than during operation one at a time, they do not come so close that they overlap and the lasers phase lock in the presence of optical cross talk. Therefore, power fluctuations as described in relation to FIG. 1, above, do not occur, and hatching would not occur if laser device 100 as in FIG. 6 were operated under the operating conditions used in many known laser printers.

As noted above, lasers 102 and 104 would ordinarily have a small initial wavelength difference prior to cut 160. It can be understood from FIG. 8 that the wavelength shift Δλ due to increasing operating temperature of one laser must be considerably greater than the initial wavelength difference.

This avoids the problem that would occur if Δλ were approximately equal to but opposite in direction than the initial wavelength difference, in which case cut 160 would cause the spectra to be closer together, increasing the risk of phase locking. Instead, Δλ must be great enough to provide a safe margin between the primary peaks of the two spectra despite the initial wavelength difference.

The technique described in relation to FIGS. 6-8 could be applied in various other ways. For example, appropriate cuts similar to cut 160 could be made in the metal contacts of both lasers 102 and 104 but positioned differently so that the lasers operate with different wavelength spectra that are shifted but do not overlap. Furthermore, by adding one or more wire bond connections, it may be possible to perform laser ablation to produce a cutout area (and therefore an uncovered and isolated area) near the center of one of the laser stripes, such as laser stripe 114; this could be advantageous because it would avoid any difference between the front and back mirror facets of lasers 102 and 104, and may also allow greater manufacturing tolerance due to less sensitivity to the location of the cutout area.

More generally, the techniques described above in relation to FIGS. 3-8 could be varied in many ways. The conductive material that provides contact with laser stripes 112 and 114 could be a conductive material other than metal, such as indium-tin-oxide (ITO), doped epitaxial material, or other doped semiconductor material such as heavily doped amorphous silicon. Furthermore, rather than using a modified mask as in FIGS. 3 and 4 or using laser ablation as in FIG. 6, other techniques could be used to produce different contact structures. Examples include variations in etching, differences in liftoff, use of a shadow mask to modify deposition of conductive material, and any other appropriate form of patterning that modifies the shape of the conductive material differently for one laser than for another.

FIGS. 9 and 10 show two alternative implementations in which the contact structure of one laser is asymmetric with the other, but in which the modification of the contact structure to provide uncovered, isolated areas is symmetric within the laser. These techniques may avoid problems that could arise if conductive material does not extend symmetrically over the front and back facets of both lasers. In both FIGS. 9 and 10, the distance from the front and back facet to the nearest cutout area is the same, both to avoid interaction between the cleaving of the facets and the cutout areas and also to maintain symmetry between the facets.

In FIG. 9, device 100 can be produced with cutout area 180 in metal contact 118. Within cutout area 180, laser stripe 114 and insulating layer 132 are exposed. The length of cutout area 180 is X, similar to FIG. 6 where X is approximately 25% of the length L of laser stripes 112 and 114. Therefore, device 100 in FIG. 9 should function in substantially the same way as that of FIG. 6.

In FIG. 10, device 100 illustratively has six evenly spaced cutout areas 190, within each of which laser stripe 114 and insulating layer 132 are exposed, as in FIG. 9. Each cutout area has a length of X/6, so that the total cutout length is again X. It is expected that this arrangement will also produce results similar to the implementation of FIG. 6. The number of cutouts, however, is purely arbitrary, and any other appropriate number could be used. In addition, rather than being regularly spaced as in FIG. 10, the cutout areas could be spaced in any other appropriate way.

In each of the implementations of FIGS. 3-10, a part of one laser's contact structure is different than the other's; more specifically, in these implementations, one laser's contact structure has uncovered, isolated areas defined within it while the other laser's contact structure does not. Various other types of differences between current flow structures can be employed to produce a required difference in wavelength, as illustrated by the implementations described below.

Figure 11:
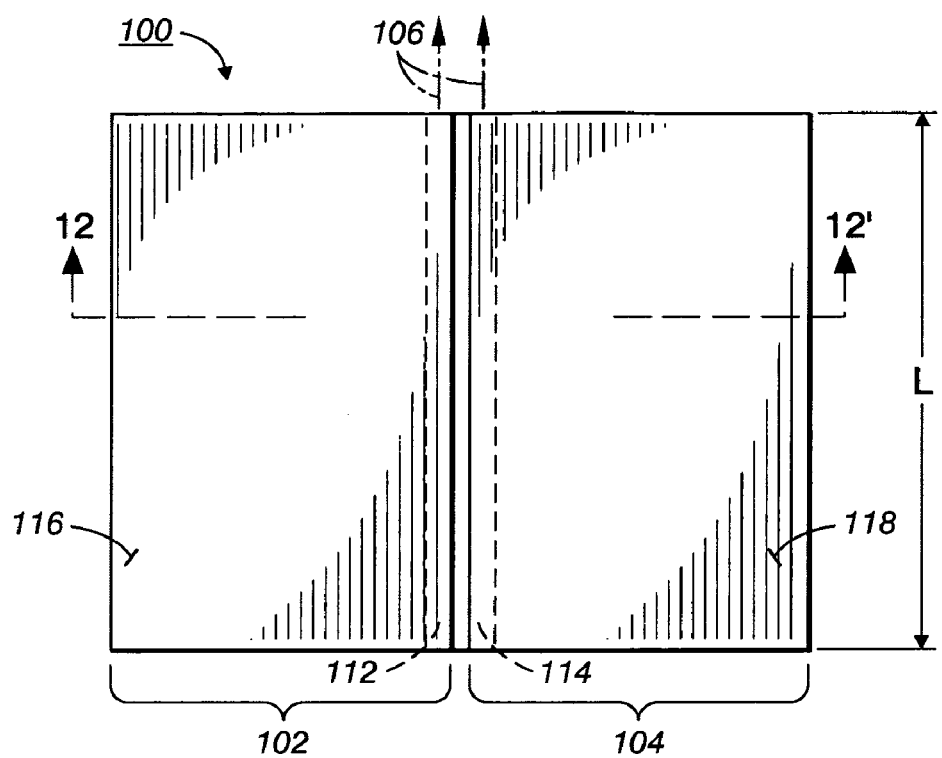
FIG. 11 is a top plan view of a dual beam laser structure in which contact structures have different thicknesses to affect phase locking.

FIG. 11 is a top plan view of device 100, similar to the devices of FIGS. 3-6, 9, and 10, except that metal contacts 116 and 118 are of different thicknesses. The theoretical basis for this approach is that different contact thicknesses in different lasers should produce different thermal resistances. This should translate into a temperature gradient and wavelength shift even though the operating conditions for both lasers remain almost unchanged. If successfully implemented, this approach would be advantageous because the changes would not affect either laser cavity and therefore should not affect device performance or lifetime. Lasers 102 and 104 would still maintain very similar light intensity-current characteristics, but with slightly different emission wavelengths.

Figure 12:
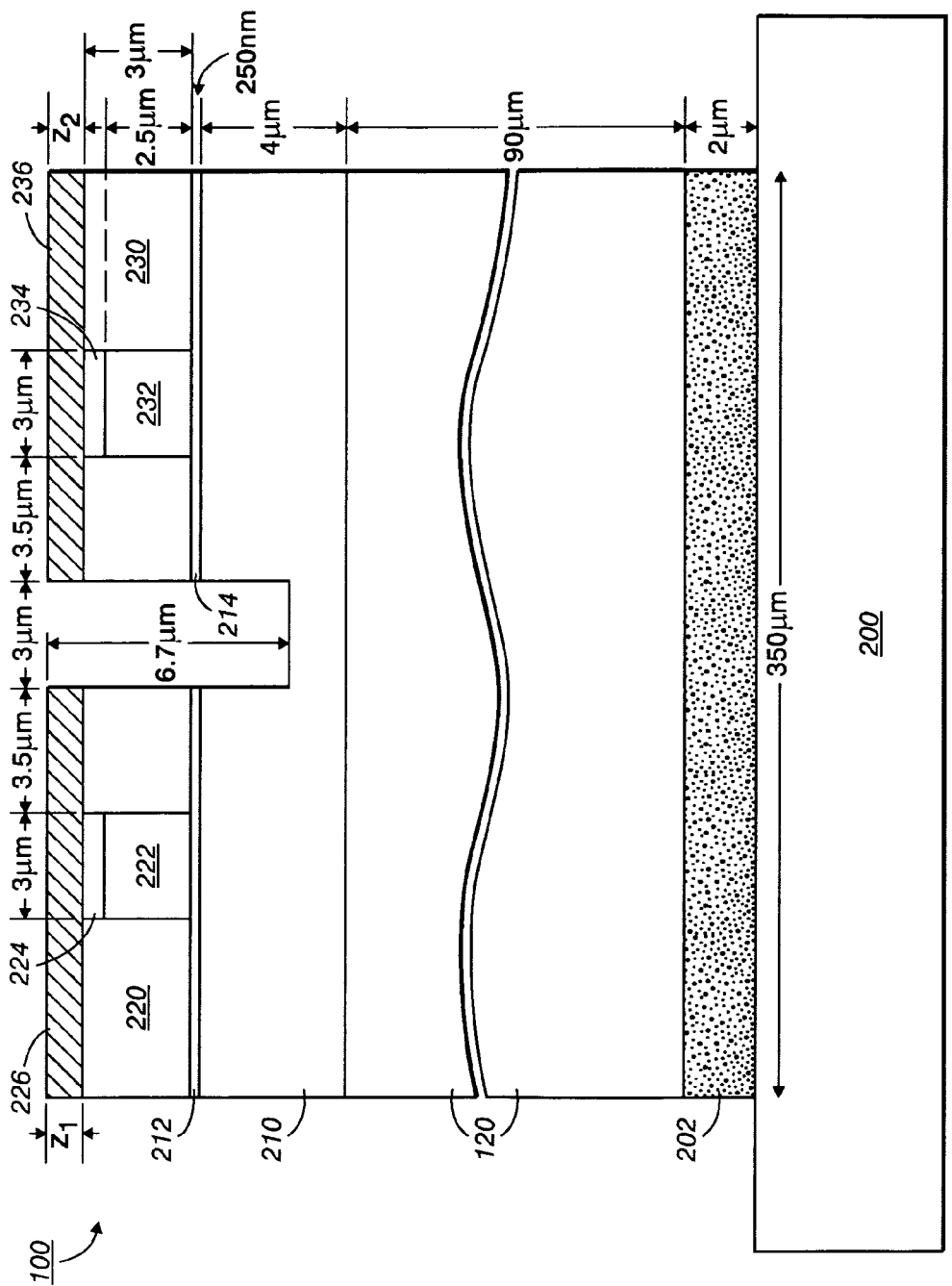
FIG. 12 is a schematic, distorted cross-sectional view taken along the line 12-12' in FIG. 11.

Although the technique has not yet been tested experimentally, it has been simulated based on the dimensions and other parameters shown in the schematic, distorted cross-sectional view in FIG. 12, taken along the line 12-12' in FIG. 11. The simulation assumed that device 100 had a threshold current of 14 mA, differential efficiency of 47%, operating current of 25 mA, and operating voltage of 1.8 V.

The lowest layer in FIG. 12 is heat sink 200, which can include any suitable material at any suitable thickness. Between heat sink 200 and substrate 120 is a 2 μm layer 202 of solder that holds the two together, deposited at 0.57 W/cm-K. Substrate 120 is a GaAs substrate 90 μm thick, deposited at 0.45 W/cm-K. The first epitaxial layer on substrate 120 is a 4 μm n-doped cladding layer 210 deposited at 0.11 W/cm-K. Active layers 212 and 214 of lasers 102 and 104, respectively, include a 250 nm layer of double quantum well (DQW) material deposited at 0.21 W/cm-K. Laser stripes 112 and 114 include, respectively, portions 222 and 232 of a 2.5 μm p-doped cladding layer deposited at 0.11 W/cm-K and portions 224 and 234 of a 0.5 μm p-doped capping layer deposited at 0.45 W/cm-K. Lasers 102 and 104 include, respectively, portions 220 and 230 of a 3 μm confinement layer deposited at 0.11 W/CM-K, surrounding the laser stripes. Metal contact layers or electrodes 226 and 236 on lasers 102 and 104, respectively, are deposited at 3.2 W/cm-K and can be any appropriate p-metal or other conductive material. As shown, layer 226 has a thickness of $Z_1$, while layer 236 has a thickness of $Z_2$.

The simulation produced the following temperature differences for values of $Z_1$ and $Z_2$: for $Z_1=1$ μm and $Z_2=2$ μm, the temperature difference was 0.4° C.; for $Z_1=1$ μm and $Z_2=3$ μm, the temperature difference was 0.6° C.; and for $Z_1=0.5$ μm and $Z_2=1$ μm, the temperature difference was 0.3° C.

FIG. 13 shows a simulated thermal profile. The graph of FIG. 13 shows temperature along a line through the center of the active regions of lasers 102 and 104, which are approximately 3 μm wide and begin at approximately +5 μm and −5 μm in the figure. The left peak in FIG. 13 shows the temperature within laser 104, with $Z_2=3$ μm; the right peak shows temperature within laser 102, with $Z_1=1$ μm. The operating current for both lasers is 28 mA. A 0.6 degree C. temperature difference between the two lasers is induced by the difference in thermal resistance, according to this simulation.

The technique of FIGS. 9-11, if it can be successfully implemented, may also be applicable if different electrode materials or different layers of materials are used in the two lasers. Another variation would be to make the electrodes thicker only along part of the length of a laser stripe or to add non-electrode thermal conducting material along part of the length of a laser stripe. Additional thermal conducting material would provide another path for thermal current out of the laser in addition to the path provided by the electrode material.

FIG. 14 shows a stage in producing device 100 as in FIGS. 11 and 12. In FIG. 14, an array of lasers has been fabricated on a surface of wafer 250, which can be the material of substrate 120. Exemplary lasers 252 and 254 are fabricated as symmetrical edge-emitting lasers as, for example, in FIG. 11, but with metal contacts 116 and 118 of equal thickness. A seed layer for plating can be deposited on the metal contacts 116 and 118 if necessary. In addition, lead structure 260 has also been fabricated on the surface of wafer 250, connected to laser 254's metal contact 118 and to the counterpart metal contact of each of the other laser pairs in the array.

A part, component, surface, or other element is described herein as "plated" if it was produced by plating or removing material, such as by electroless plating, electroplating, electroetching, or other electrodeposition or removal. For example, electroplating, electroetching, or other electrodeposition or removal may be performed on the structure in FIG. 14, such as by immersing the array of lasers on the surface of wafer 250 in an electroplating solution or an electroetching bath or by an appropriate dry electroprocess. During this stage, an appropriate voltage $V_{plate}$ is applied to lead structure 260 at the periphery of wafer 250, controlling the rate of electroactivity; an alternative approach would be to contact each laser's metal contact pad individually with a matching probe card. By measuring the current and/or time duration of the process, the amount of the material added or removed from metal contact 254 can be controlled.

During plating, special attention must be paid to ensure that plated metal does not bridge across the gap between a pair of lasers, typically approximately 3 μm. Bridging could even occur between stripes 112 and 114 across the gap. One solution would be to experimentally find conductivity values that avoid bridging for a given implementation.

When the desired difference in thickness between metal contacts of each pair of lasers has been produced, wafer 250 can be sawed into chips, such as along lines 256 and 258. Lead structure 260 can be removed in the saw kerfs. Conventional steps can then be taken to package each pair of lasers and provide appropriate connections to electrical circuitry.

The technique of FIG. 14 is advantageous because it does not require a mask to produce a difference in current flow structure between lasers. It can also be extended to devices with more than two lasers, by repeating a similar step for all but one of the lasers on the chip. Various materials could be used in this process to enhance the difference in thermal conductance between lasers.

Figure 15:
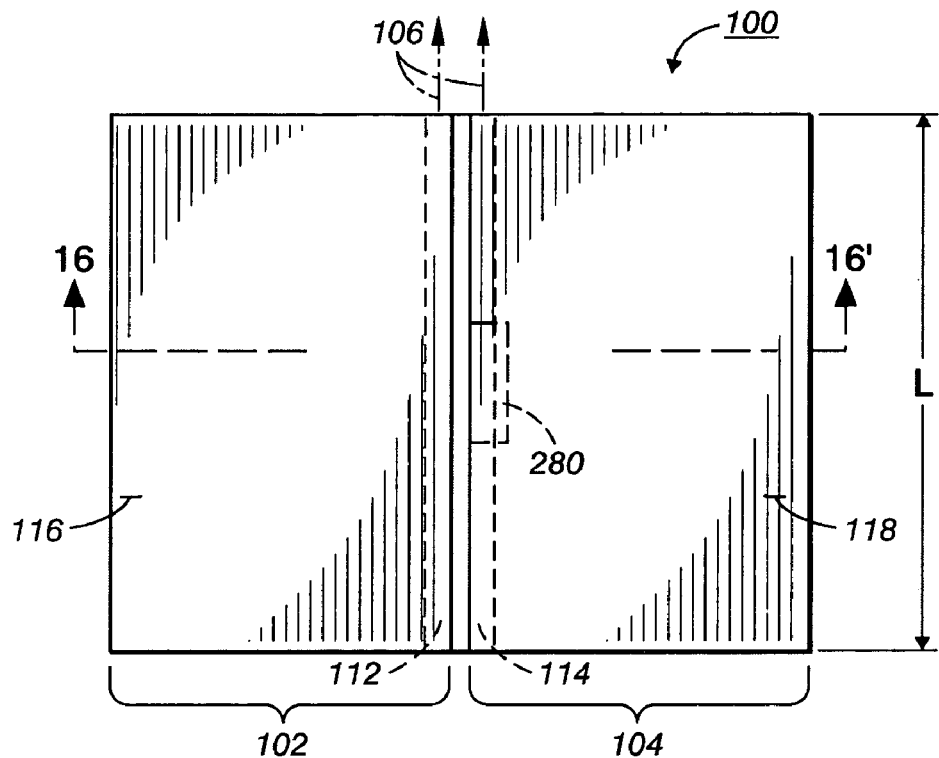
FIG. 15 is a top plan view of a dual beam laser structure in which one laser's contact structure includes a patterned high resistance layer that is different than the other laser's contact structure.
Figure 16:
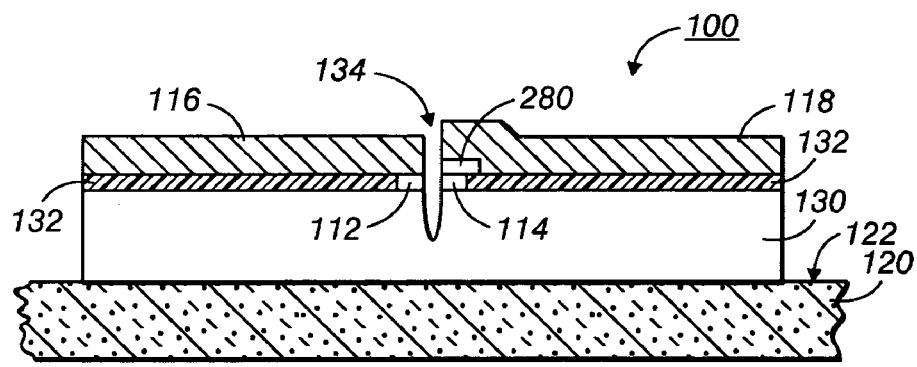
FIG. 16 is a cross-sectional view taken along the line 16-16' in FIG. 15.

FIGS. 15 and 16 show another approach in which high resistance material 280 is put between metal contact 118 and laser stripe 114, illustratively along a length similar to that of the cutout area in FIG. 9. A pattern of insulating material similar to the cutout areas in FIG. 10 could also be used. High resistance material 280 could be a dielectric such as an oxide or nitride or a partially conductive material such as amorphous silicon; in any case, it must make an area between metal contact 118 and laser stripe 114 more resistive than areas in which it is not present.

The technique in FIGS. 15 and 16 would require additional masks and additional process steps, and therefore may be more expensive to implement than the techniques described for implementing FIG. 9.

Figure 17:
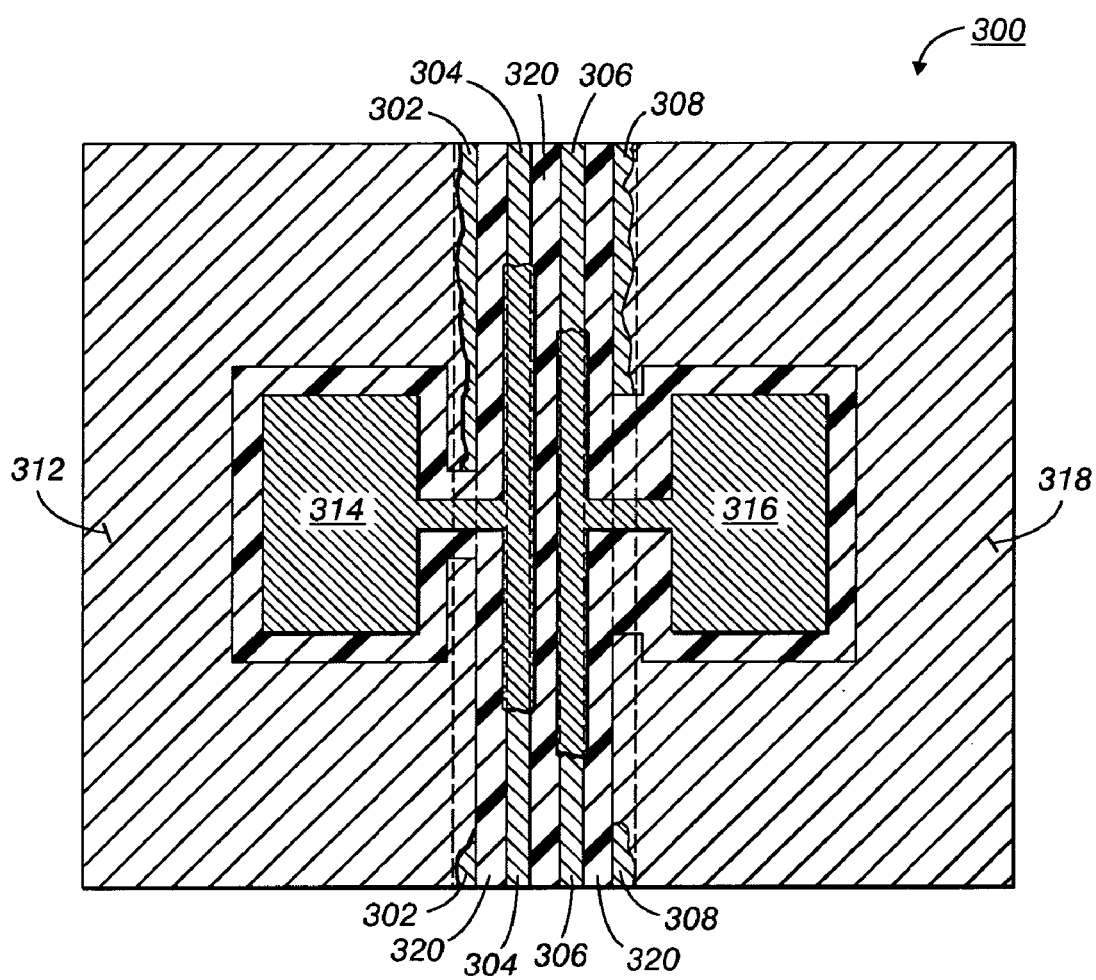
FIG. 17 is a partially cutaway top plan view of an implementation of a quad beam laser in which one laser's contact structure includes a patterned high resistance layer different than another laser's contact structure.

FIG. 17 illustrates quad spot laser device 300 with laser stripes 302, 304, 306, and 308 driven respectively by metal contacts 312, 314, 316, and 318. General features of device 300 can be understood from U.S. Pat. No. 6,052,399, incorporated herein by reference. In such a structure, adjacent laser elements are more likely to phase lock and produce hatching than laser elements that are farther apart. Device 300 might be operated so that some combinations of adjacent laser elements are phase locked, while others do not.

The implementation in FIG. 17 is intended to affect phase locking between certain combinations of lasers by patterning insulating material 320 differently between metal contact 314 and laser stripe 302 than between metal contact 316 and laser stripe 308. As can be seen, more of laser stripe 308 is covered by insulating material 320 than of laser stripe 302, with the total covered amount being roughly 25% of the length of the laser stripes.

The technique of FIG. 17 is not limited to a quad spot device, but could be applied to other multiple spot laser devices. In addition, other techniques described herein could similarly be applied to quad spot or other multiple spot laser devices.

Figure 18:
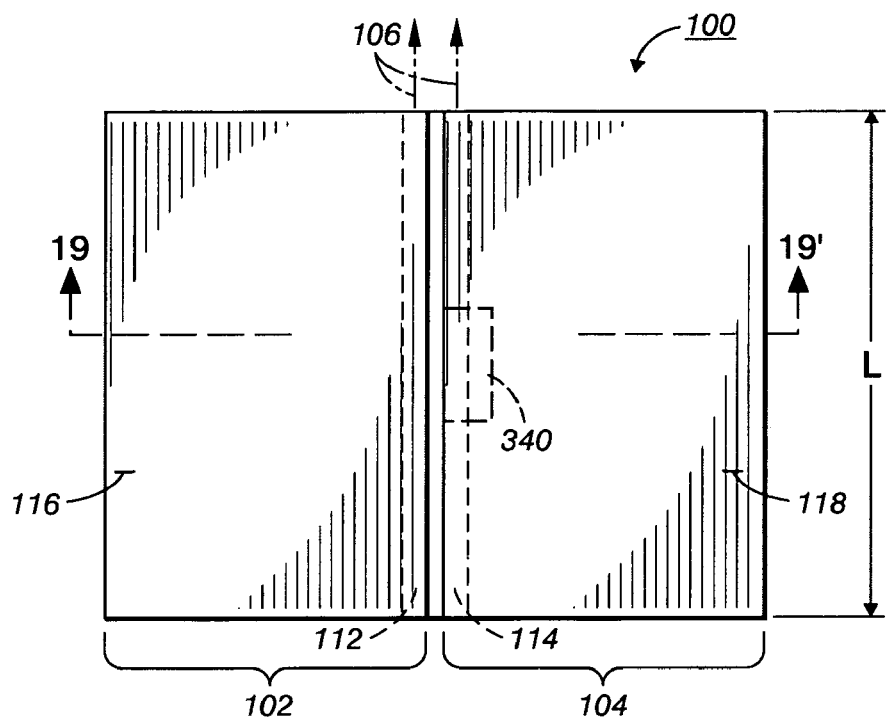
FIG. 18 is a top plan view of a dual beam laser structure in which one laser's epitaxial semiconductor structure includes a high resistance region different than the other laser.
Figure 19:
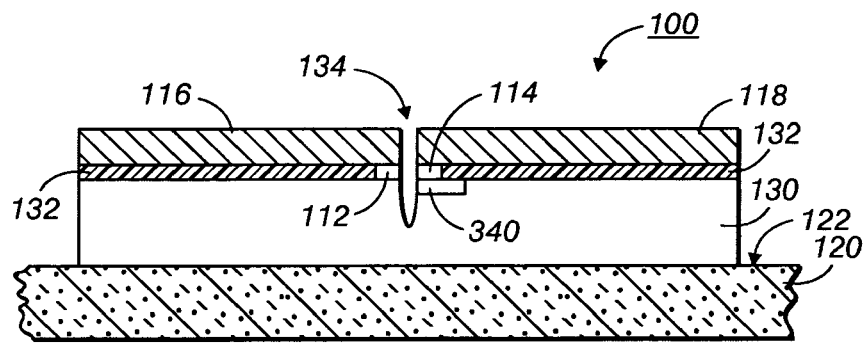
FIG. 19 is a cross-sectional view taken along the line 19-19' in FIG. 18.

FIGS. 18 and 19 show yet another approach in which current flow is modified differently in different lasers, by modifying or, in a sense, damaging region 340 of the epitaxial semiconductor structure to have more carrier traps, such as by growing region 340 to have higher resistance or by ion implantation to increase resistance. Distribution of ions, such as hydrogen or oxygen, would not be confined to a sharp boundary, but would have a Gaussian-like distribution profile, with the depth depending on ion species, implant energy, and on the ease with which ions pass through the layers. Region 340 illustratively extends along a length similar to that of the cutout area in FIG. 9, but pattern of insulating material similar to the cutout areas in FIG. 10 could also be used. As in FIGS. 15 and 16, region 340 must make an area more resistive than areas in which it is not present.

As in the case of FIGS. 15 and 16, the technique in FIGS. 18 and 19 would require additional masks and additional process steps, and therefore may be more expensive to implement than the techniques described for implementing FIG. 9.

The implementations described above could be modified in various ways within the scope of the invention. For example, the above implementations generally involve closely spaced edge emitting lasers but the techniques could be used in other types of lasers, and it is foreseeable that other types of lasers will be developed in which the techniques could be used. Similarly, the above implementations generally involve semiconductor structures with particular geometries and dimensions, but the techniques could be used with other geometries and dimensions. Similarly, the above implementations involve types of lasers that typically emit in the infrared region, but the same or similar techniques could be used in lasers that emit in other regions of the spectrum, including the visible and ultraviolet regions.

Some of the above exemplary implementations involve specific materials, such as specific semiconductor materials and metals, but the invention could be implemented with a wide variety of materials, including various substrates and other support structures, various semiconductor materials, and various conductive materials. For example, rather than being GaAs-based, the lasers could be based on any other suitable semiconductor material, with appropriate modifications; for gallium nitride semiconductors, for example, the substrate would typically be nonconductive, so that all contacts would be at or above the surface rather than through the substrate as is possible with GaAs. Similarly, other conductive materials could be used in current flow structures, including various metals, alloys, and conductive metal oxides, such as indium-tin-oxide; it might also be possible to use doped semiconductor materials such as heavily doped amorphous silicon.

In addition to the specific current flow structures and types of differences described above, various other types of current flow structures could be used, including structures with additional layers and with different shapes, for example. Also, rather than having a difference between current flow structures, other types of wavelength control structures could be used to obtain a required difference in wavelength, such as gratings on a surface of a semiconductor structure or other techniques that differentially alter or adjust optical properties of lasers. For example, some conventional techniques etch epitaxial material or otherwise modify a surface to modulate refractive index, creating a grating that defines a waveguide mode allowing only one wavelength.

The above exemplary implementations generally involve production of structures following particular operations, but different operations could be performed, the order of the operations could be modified, and additional operations could be added within the scope of the invention. For example, semiconductor structures that satisfy a semiconductor symmetry constraint could be formed in other ways than by concurrent epitaxial growth followed by concurrent patterning.

Devices and structures like those described above have a wide range of applications. A semiconductor laser can, for example, be packaged in a can with wire bonds connecting pads of the lasers through the can's lid, and then can would then be appropriately mounted, such as on a board that also holds drive circuitry and other controller circuitry. Such devices can be used, as noted above, in printers, and could also be used in CD or DVD recorders, in laser projectors, or in various other applications, including foreseeable future applications.

Further, rather than preventing phase locking, techniques for controlling wavelength as described above could be applied to affect phase locking in various other ways; for example, such techniques could be used to induce or control phase locking. Also, techniques that affect wavelength or produce wavelength differences as described above could be applied in ways other than to affect phase locking; for example, such techniques could be used to address other cross-talk issues.

While the invention has been described in conjunction with specific exemplary implementations, it is evident to those skilled in the art that many other alternatives, modifications, and variations will be apparent in light of the foregoing description. Accordingly, the invention is intended to embrace all other such alternatives, modifications, and variations that fall within the spirit and scope of the appended claims.

What is claimed is:

1. A device comprising:
    a support structure; and
    at least two lasers on the support structure, each including:
        a semiconductor structure that emits light in response to stimulation; the semiconductor structures of a subset of two or more of the lasers including the same semiconductor material and having substantially the same geometry; and
        a current flow structure that affects current flow through the laser's semiconductor structure; the current flow structures of a pair of lasers in the subset being differently structured to affect wavelengths of light emitted from the semiconductor structures of the pair of lasers.

2. The device of claim 1 in which the pair of lasers are concurrently operated.

3. The device of claim 1 in which the differently structured current flow structures affect phase locking between the pair of lasers.

4. The device of claim 1 in which the pair of lasers are independently addressable.

5. The device of claim 1 in which the semiconductor structures of the lasers in the subset include concurrently formed epitaxial material.

6. Apparatus comprising:
    a laser device that includes:
        a support structure; and
        at least two lasers on the support structure, each including:
            a semiconductor structure that emits light in response to stimulation; the semiconductor structures of a subset of two or more of the lasers including the same semiconductor material and having substantially the same geometry; and
            a current flow structure that affects current flow through the laser's semiconductor structure; and
    drive circuitry that drives each of a pair of lasers in the subset within a respective range of operating conditions;
    the current flow structures of the pair of lasers being differently structured to affect wavelengths of light emitted from the semiconductor structures of the pair of lasers when each is driven within its respective range of operating conditions.

7. The apparatus of claim 6 in which the apparatus is a printer.

8. The apparatus of claim 6 in which the current flow structures of the pair of lasers are sufficiently different to prevent phase locking between the pair of lasers when each is driven within its respective range of operating conditions.

9. A device comprising:
    a support structure; and
    at least two lasers on the support structure, each including:
        a semiconductor structure that emits light in response to stimulation; the semiconductor structures of a subset of two or more of the lasers including the same semiconductor material and having substantially the same geometry; and
        a wavelength control structure that affects the wavelength at which the laser's semiconductor structure emits light; the wavelength control structures of a pair of lasers in the subset being different so that the wavelengths at which the pair of lasers emit differ by at least a required difference in wavelength.

10. A device comprising:
    a support structure; and
    at least two lasers on the support structure, each including:
        a semiconductor structure with an emitting region that emits light in response to stimulation; the semiconductor structures of a subset of two or more of the lasers being substantially identical; and a contact structure electrically or thermally connected to the semiconductor structure;

in each laser, the contact structure and the semiconductor structure providing a conductive path between the emitting region and an external component; the conductive paths in first and second lasers in the subset having different characteristics that affect the wavelengths of light emitted by the emitting regions of the first and second lasers.

11. The device of claim 10 in which the contact structures of the first and second lasers include first and second patterned conductive layers, respectively; each conductive layer extending in the respective laser's longitudinal direction; the first laser's semiconductor structure having at least one isolated area in which it does not receive electrical current from a covering part of the first patterned conductive layer.

12. The device of claim 11 in which the second laser's semiconductor structure has at least one isolated area in which it does not receive electrical current from a covering part of the second patterned conductive layer; the semiconductor structures of the first and second lasers having different isolated areas so that the first and second lasers have different threshold currents.

13. The device of claim 11 in which each isolated area is an uncovered area in which the first laser's semiconductor structure is not covered by the first patterned conductive layer.

14. The device of claim 10 in which the contact structures of the first and second lasers include first and second patterned metal layers, respectively; the first patterned metal layer being thicker than the second patterned metal layer.

15. The device of claim 10 in which the contact structures of the first and second lasers include first and second plated layers, respectively; the first plated layer being differently plated than the second plated layer.

16. The device of claim 10 in which the contact structures of the first and second lasers have different lengths in the respective laser's longitudinal direction.

17. The device of claim 10 in which the contact structure of the first laser includes:
 a conductive layer; and
 a patterned layer with high electrical resistance between the semiconductor structure and the conductive layer in the contact structure; the patterned layer being different than the contact structure of the second laser.

18. The device of claim 10 in which the semiconductor structure of the first laser comprises:
 one or more regions of high electrical resistance adjacent the first laser's contact structure; the regions of high electrical resistance being different than in the second laser.

19. The device of claim 18 in which the regions of high electrical resistance are ion implanted regions.

20. A method of producing a device, comprising:
 on a support structure, producing at least two lasers, each including:
  a semiconductor structure that emits light in response to stimulation; and
  a current flow structure that affects current flow through the laser's semiconductor structure;
 the act of producing the lasers comprising:
  producing the semiconductor structures of a subset of the lasers to include the same semiconductor material and have substantially the same geometry; and
  producing the current flow structures of a pair of lasers in the subset with different structures to affect wavelengths of light emitted by the semiconductor structures of the pair of lasers.

21. The method of claim 20 in which the act of producing the semiconductor structures comprises:
 producing the semiconductor structures concurrently.

22. The method of claim 20 in which the current flow structure of each of the pair of lasers includes a respective plated layer; the act of producing the current flow structures comprises:
 plating the respective plated layers of the pair of lasers differently.

23. A device comprising:
a support structure; and
at least two lasers on the support structure, each including:
 a respective semiconductor structure that emits light in response to stimulation; and
 a respective current flow structure that affects current flow through the laser's semiconductor structure;
in all of a subset that includes two or more of the lasers, the respective semiconductor structures being substantially identical and including concurrently formed epitaxial semiconductor material that is the same;
in a pair of the lasers in the subset that are independently addressable, the respective current flow structures being structured to affect current flow through the respective semiconductor structure differently than each other, to affect wavelengths of light emitted from the semiconductor structures of the pair of lasers differently, and to affect phase locking between the pair of lasers when concurrently operated.

24. The device of claim 23 in which the device comprises two lasers on the support structure.

25. The device of claim 23 in which the device comprises four lasers on the support structure.

26. The device of claim 23 in which each of the pair of lasers is an edge-emitting laser.

27. The device of claim 23 in which the pair of lasers are adjacent on a surface of the support structure.

28. The device of claim 23 in which each laser's current flow structure includes a metal contact layer.

29. The device of claim 23 in which the respective current flow structures are structured to cause the pair of lasers to have different threshold currents.

30. The device of claim 23 in which the respective current flow structures are structured to cause the pair of lasers to have different operating temperatures.

31. The device of claim 23, further comprising:
a laser structure on the support structure, the laser structure including:
 the semiconductor structures of the lasers in the subset.

32. A device comprising:
a support structure; and
at least two lasers on the support structure, each including:
 a respective semiconductor structure that emits light in response to stimulation; and
 a respective wavelength control structure that affects the wavelength at which the laser's semiconductor structure emits light; the wavelength control structure providing a respective conductive path between the semiconductor structure and an external component;
in all of a subset that includes two or more of the lasers, the respective semiconductor structures being substantially identical and including concurrently formed epitaxial semiconductor material that is the same;
in a pair of the lasers in the subset that are independently addressable, the respective wavelength control structures being different so that the respective conductive paths have different characteristics and wavelengths at which the pair of lasers emit differ by at least a difference in wavelength required to prevent phase locking between the pair of lasers when concurrently operated.

33. The device of claim 32 in which each laser's wavelength control structure includes a metal contact layer.

34. A device comprising:

a support structure; and at least two lasers on the support structure, each including:
- a respective semiconductor structure with an emitting region that emits light in response to stimulation; and
- a respective contact structure electrically or thermally connected to the laser's semiconductor structure;

in all of a subset that includes two or more of the lasers, the respective semiconductor structures having substantially the same geometry and including concurrently formed epitaxial semiconductor material that is the same;

in each of first and second independently addressable lasers in the subset, the respective contact structure and semiconductor structure providing a conductive path between the emitting region and an external component; the conductive paths in the first and second lasers having different characteristics that affect the wavelengths of light emitted by the emitting regions of the first and second lasers and that affect phase locking between the first and second lasers when concurrently operated;

the respective contact structures of the first and second lasers including first and second patterned conductive layers, respectively, with each conductive layer extending in the respective laser's longitudinal direction; the different characteristics of the first and second lasers including at least one of the following:

the first laser's semiconductor structure has at least one isolated area in which it does not receive electrical current from a covering part, the isolated area being different than in the second laser;

the first and second patterned conductive layers are metal layers of different thicknesses;

the first and second patterned conductive layers are differently plated layers;

each of the first and second patterned conductive layers has a respective length in the respective laser's longitudinal direction, the respective lengths being different;

the first laser's contact structure further includes a patterned high electrical resistance layer between the respective semiconductor structure and the first patterned conductive layer, the patterned high electrical resistance layer being different than in the contact structure of the second laser; and the first laser's semiconductor structure includes one or more regions of high electrical resistance adjacent the first laser's contact structure, the regions of high electrical resistance being different than in the second laser.

* * * * *